US012701649B2

(12) United States Patent
Kim et al.

(10) Patent No.: US 12,701,649 B2
(45) Date of Patent: Aug. 4, 2026

(54) ANTENNA UNIT AND SUBSTRATE TREATING APPARATUS INCLUDING THE SAME

(71) Applicant: SEMES CO., LTD., Chungcheongnam-do (KR)

(72) Inventors: Dae Hyun Kim, Seoul (KR); Kyung Hwan You, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 110 days.

(21) Appl. No.: 18/628,715

(22) Filed: Apr. 6, 2024

(65) Prior Publication Data

US 2025/0008636 A1    Jan. 2, 2025

(30) Foreign Application Priority Data

Jun. 30, 2023    (KR) ........................ 10-2023-0084971

(51) Int. Cl.
*H05H 1/46* (2006.01)
*H01J 37/32* (2006.01)

(52) U.S. Cl.
CPC ....... *H05H 1/466* (2021.05); *H01J 37/32091* (2013.01)

(58) Field of Classification Search
None
See application file for complete search history.

(56) References Cited

U.S. PATENT DOCUMENTS 6,124,833 A    9/2000  Bialkowski et al.
9,167,680 B2 *  10/2015  Yamazawa ............... H05H 1/46
(Continued)

FOREIGN PATENT DOCUMENTS

KR    10-2003-0004426    1/2003
KR    10-2004-0099317    11/2004
(Continued)

OTHER PUBLICATIONS

Office Action dated Dec. 16, 2024 for Korean Patent Application No. 10-2023-0084971 and its English translation from Global Dossier.

(Continued)

*Primary Examiner* — Srinivas Sathiraju
(74) *Attorney, Agent, or Firm* — WOMBLE BOND DICKINSON (US) LLP

(57) ABSTRACT

An antenna unit having a slot structure capable of achieving maximum emission efficiency and a substrate treating apparatus including the antenna unit are provided. The substrate treating apparatus includes: a chamber housing; a substrate support unit supporting a substrate; a showerhead unit providing a process gas, which is for treating the substrate, onto the substrate; a plasma generation unit including a high-frequency power source and generating plasma in an internal space of the chamber housing using the process gas and power provided by the high-frequency power source; and an antenna unit connected to the high-frequency power source and operating as an electrode for generating the plasma, wherein the antenna unit includes a plurality of slot pairs, which are formed in a slot plate, and the slot pairs are arranged radially from a central region of the slot plate.

14 Claims, 22 Drawing Sheets

(56) References Cited

U.S. PATENT DOCUMENTS

| | | | | |
|---|---|---|---|---|
| 9,309,598 | B2 * | 4/2016 | Wang | C23F 1/12 |
| 11,915,911 | B2 * | 2/2024 | Tan | H01J 37/04 |
| 2003/0148623 | A1 | 8/2003 | Ohmi et al. | |
| 2006/0005929 | A1 | 1/2006 | Ishii et al. | |
| 2014/0062296 | A1 * | 3/2014 | Yamazawa | H01J 37/32119 |
| | | | | 315/34 |
| 2018/0230624 | A1 * | 8/2018 | Dube | C30B 25/186 |
| 2019/0116656 | A1 * | 4/2019 | Long | H01J 37/32174 |
| 2019/0119815 | A1 * | 4/2019 | Park | C23C 16/4404 |
| 2020/0090907 | A1 * | 3/2020 | Kim | H01J 37/32183 |
| 2020/0312630 | A1 * | 10/2020 | Ramaswamy | H01J 37/32091 |
| 2020/0328065 | A1 * | 10/2020 | Tan | H01J 37/04 |
| 2021/0025058 | A1 * | 1/2021 | Jiang | C23C 16/24 |
| 2021/0183620 | A1 * | 6/2021 | Tian | H01J 37/32091 |
| 2021/0287877 | A1 * | 9/2021 | Kim | H01J 37/3244 |
| 2023/0162947 | A1 * | 5/2023 | Ye | H01J 37/32541 |
| | | | | 427/579 |
| 2023/0207262 | A1 * | 6/2023 | Park | H01J 37/321 |
| | | | | 156/345.29 |
| 2023/0230809 | A1 * | 7/2023 | Matsudo | H01J 37/32357 |
| | | | | 216/37 |
| 2023/0282453 | A1 * | 9/2023 | Kim | H01J 37/32642 |
| | | | | 118/725 |
| 2024/0079215 | A1 * | 3/2024 | Yaguchi | H01J 37/32449 |
| 2024/0355586 | A1 * | 10/2024 | Cui | H01J 37/32183 |
| 2024/0355587 | A1 * | 10/2024 | Cui | H01J 37/32183 |
| 2024/0371610 | A1 * | 11/2024 | Ko | H01J 37/32642 |
| 2024/0395510 | A1 * | 11/2024 | Amikura | H01J 37/3244 |
| 2025/0008636 | A1 * | 1/2025 | Kim | H01J 37/3222 |

FOREIGN PATENT DOCUMENTS

| | | |
|---|---|---|
| KR | 10-2015-0040918 | 4/2015 |
| KR | 10-2015-0050281 | 5/2015 |
| KR | 10-2015-0063036 | 6/2015 |
| KR | 10-2022-0089566 | 6/2022 |

OTHER PUBLICATIONS

Office Action (2nd) dated Aug. 29, 2025 for Korean Patent Application No. 10-2023-0084971 and its English translation from Global Dossier.

* cited by examiner

<u>280</u>

330

320

310

D3

D1

D2

322

A

A

280

340

330

320

310

D3

D2  D1

ANTENNA UNIT AND SUBSTRATE TREATING APPARATUS INCLUDING THE SAME

CROSS-REFERENCE TO RELATED APPLICATION

This application claims priority from Korean Patent Application No. 10-2023-0084971 filed on Jun. 30, 2023 in the Korean Intellectual Property Office, and all the benefits accruing therefrom under 35 U.S.C. 119, the contents of which in its entirety are herein incorporated by reference.

BACKGROUND

1. Field

The present disclosure relates to a substrate treating apparatus including an antenna unit, and more particularly, to a substrate treating apparatus using an antenna unit as an electrode to generate plasma and using the plasma to treat substrates.

2. Description of the Related Art

In the case of treating a semiconductor substrate using plasma, an electro-static chuck (ESC) and an antenna unit can be used as electrodes to generate plasma in a discharge space. To form plasma at a high density over a wide area, an antenna unit including a radial line slot antenna (RLSA) can be used as an electrode.

However, the RLSA was originally developed as a communication antenna for long-distance radiation, and thus has the problem of being unsuitable for application in a chamber's cavity environment.

SUMMARY

Aspects of the present disclosure provide an antenna unit with a slot structure capable of achieving maximum radiation efficiency, and a substrate treating apparatus including the antenna unit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate treating apparatus includes: a chamber housing; a substrate support unit disposed in the chamber housing and supporting a substrate; a showerhead unit disposed in the chamber housing and providing a process gas, which is for treating the substrate, onto the substrate; a plasma generation unit including a high-frequency power source and generating plasma in an internal space of the chamber housing using the process gas and power provided by the high-frequency power source; and an antenna unit connected to the high-frequency power source and operating as an electrode for generating the plasma, wherein the antenna unit includes a plurality of slot pairs, which are formed in a slot plate, and the slot pairs are arranged radially from a central region of the slot plate.

According to another aspect of the present disclosure, an antenna unit installed in a substrate treating apparatus, which treats a substrate using plasma, to operate as an electrode, includes: a first dielectric module provided as a top cover for the chamber housing; an antenna module disposed on the first dielectric module and including a slot plate and a plurality of slot pairs, which are formed in the slot plate; and a second dielectric module disposed on the antenna module, wherein the slot pairs are arranged radially from a central region of the slot plate.

According to another aspect of the present disclosure, a substrate treating apparatus includes: a chamber housing; a substrate support unit disposed in the chamber housing and supporting a substrate; a showerhead unit disposed in the chamber housing and providing a process gas, which is for treating the substrate, onto the substrate; a plasma generation unit including a high-frequency power source and generating plasma in an internal space of the chamber housing using the process gas and power provided by the high-frequency power source; and an antenna unit connected to the high-frequency power source and operating as an electrode for generating the plasma, wherein the antenna unit includes a plurality of slot pairs, which are formed in a slot plate, the slot pairs are arranged radially from a central region of the slot plate, some of the slot pairs are disposed at positions related to crests of a microwave moving from the central region to an outer end of the slot plate and crests of a standing wave generated by a reflective wave of the microwave, and the slot pairs are arranged in a row at intervals of their respective distance from the outer end of the slot plate, calculated by the following equation: the distance$=((1/2*n)+1/4)*\lambda g$ where $\lambda g$ refers to the wavelength within a waveguide and n is 0 or a positive integer.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
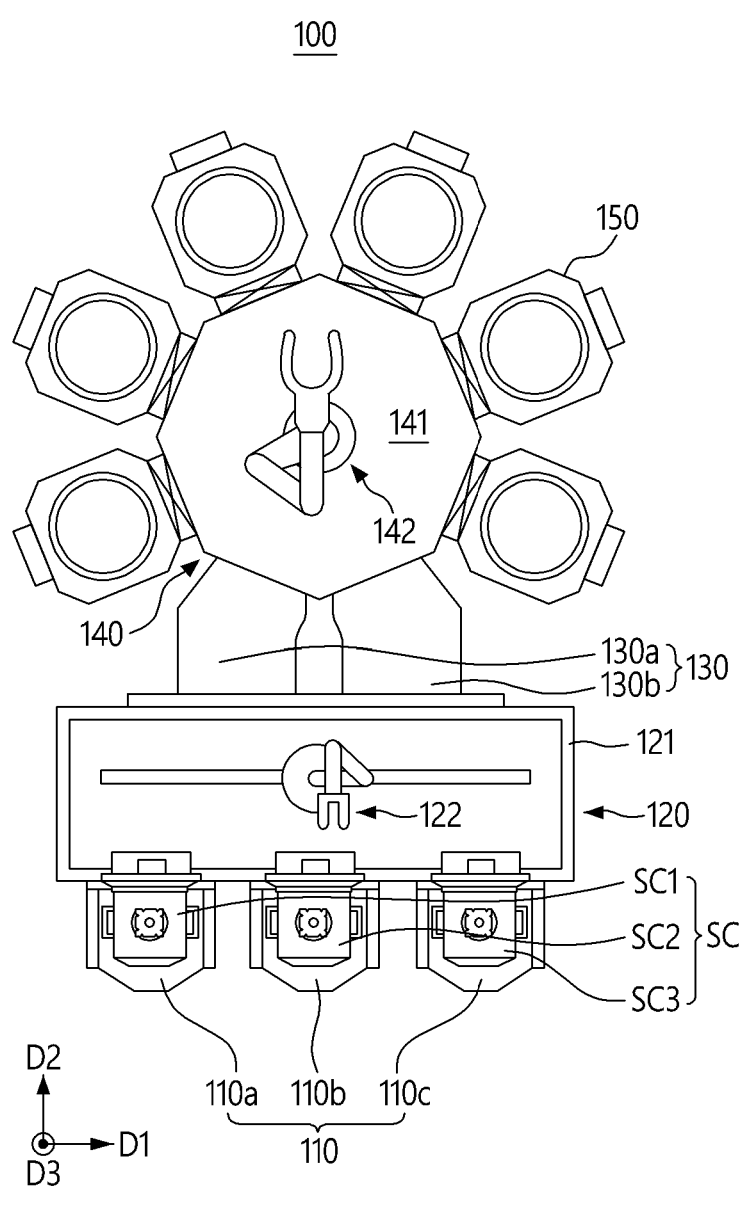
FIG. 1 is a first exemplary schematic view illustrating the internal configuration of semiconductor manufacturing equipment for treating semiconductor substrates.

Embodiments of the present disclosure will hereinafter be described with reference to the accompanying drawings. The same reference numerals are used for identical components in the drawings, and redundant explanations for these components are omitted.

A substrate treating apparatus according to an embodiment of the present disclosure may treat semiconductor substrates using plasma. For this purpose, the substrate treating apparatus may include an antenna unit. The antenna unit may include a radial line slot antenna (RLSA). The antenna unit may have a slot structure capable of achieving maximum radiation efficiency.

Figure 2:
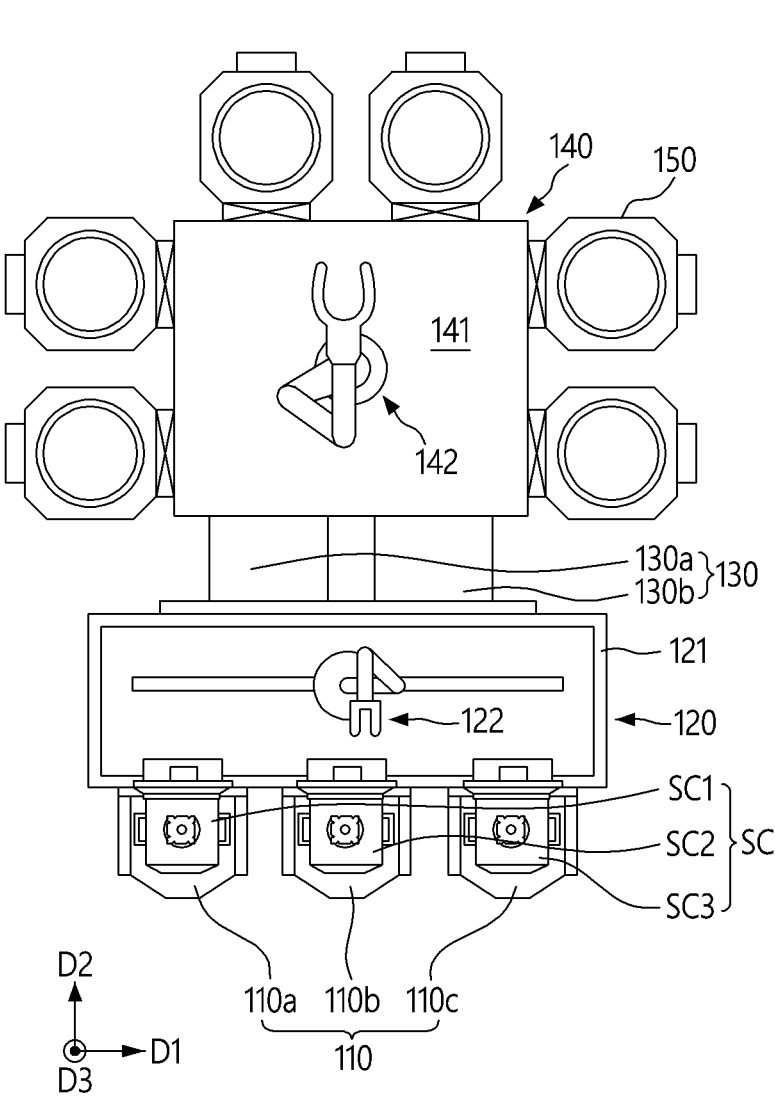
FIG. 2 is a second exemplary schematic view illustrating the internal configuration of the semiconductor manufacturing equipment for treating semiconductor substrates.
Figure 3:
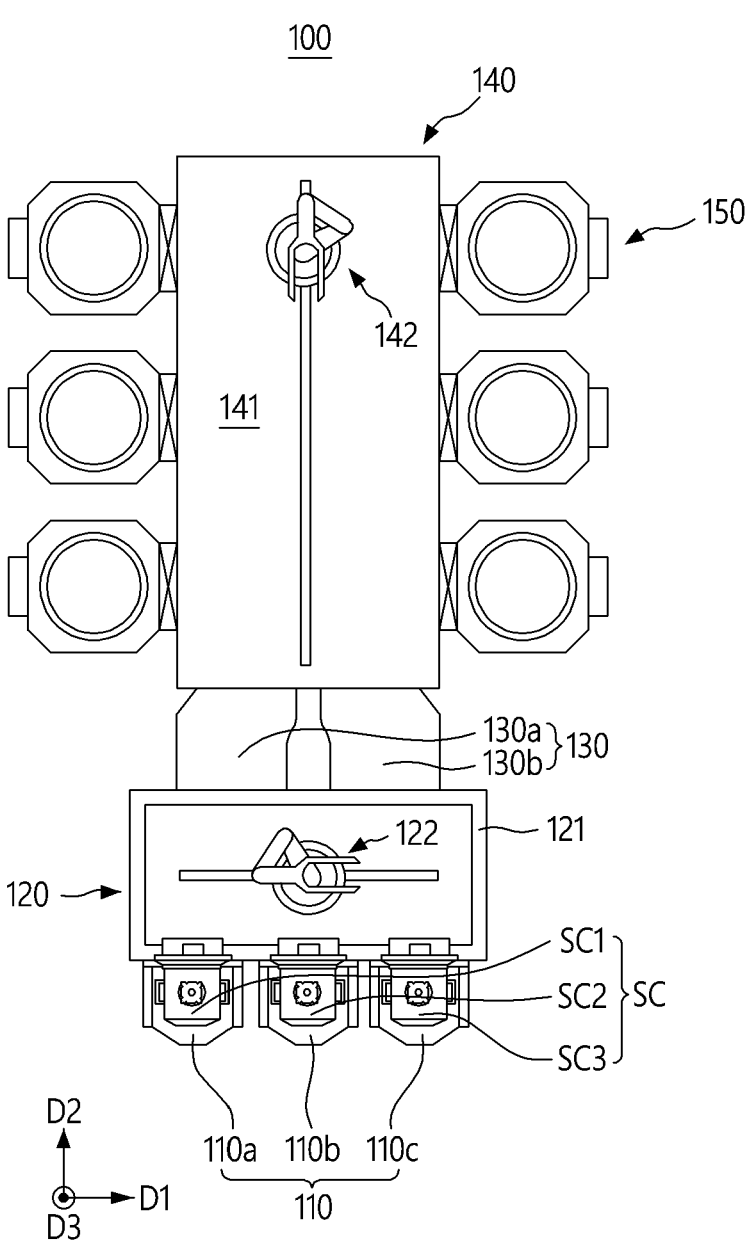
FIG. 3 is a third exemplary schematic view illustrating the internal configuration of the semiconductor manufacturing equipment for treating semiconductor substrates.

FIG. 1 is a first exemplary schematic view illustrating the internal configuration of semiconductor manufacturing equipment for treating semiconductor substrates. FIG. 2 is a second exemplary schematic view illustrating the internal configuration of the semiconductor manufacturing equipment for treating semiconductor substrates. FIG. 3 is a third exemplary schematic view illustrating the internal configuration of the semiconductor manufacturing equipment for treating semiconductor substrates.

Referring to FIGS. 1 through 3, semiconductor manufacturing equipment 100 may be configured to include load port modules 110, an index module 120, load lock chambers 130, a transfer module 140, and process chambers 150.

The semiconductor manufacturing equipment 100 is a system that treats semiconductor substrates using deposition, etching, and cleaning processes. The semiconductor manufacturing equipment 100 may include a plurality of process chambers, but the present disclosure is not limited thereto. Alternatively, the semiconductor manufacturing equipment 100 may include a single process chamber. The plurality of process chambers may include homogeneous process chambers, but the present disclosure is not limited thereto. Alternatively, the plurality of process chambers may include heterogenous process chambers. When the semiconductor manufacturing equipment 100 includes multiple process chambers, the semiconductor manufacturing equipment 100 may be configured as a multi-chamber substrate treating system.

The load port modules 110 are provided to accommodate containers SC loaded with a plurality of semiconductor substrates. The containers SC may be, for example, front opening unified pods (FOUPs).

The containers SC may be loaded into or unloaded from the load port modules 110. Additionally, semiconductor substrates stored in the containers SC may also be loaded into or unloaded from the load port modules 110.

When targets to be loaded or unloaded are the containers SC, a container transport device may load or unload the containers SC. Specifically, when loading the containers SC, the container transport device may grip and hold the containers SC and then place the containers SC onto the load port modules 110. When unloading the containers SC, the container transport device may grip the containers SC off of the load port modules 110. Although not illustrated in FIGS. 1 through 3, the container transport device may be configured as an overhead hoist transporter (OHT).

When the targets to be loaded or unloaded are semiconductor substrates, a first transport robot 122, which is provided in the index module 120, may load or unload the semiconductor substrates. When unloading the semiconductor substrates, once the containers SC are mounted on the load port modules 110, the first transport robot 122 may approach the load port modules 110 and may then retrieve the semiconductor substrates from the containers SC, which are mounted on the load port modules 110. When loading the semiconductor substrates, once treated semiconductor substrates are provided to the load lock chambers 130, the first transport robot 122 may retrieve the treated semiconductor substrates from within the load lock chambers 130 and then place the treated semiconductor substrates in the containers SC.

A plurality of load port modules 110 may be disposed in front of the index module 120. For example, three load port modules, i.e., first, second, and third load port modules 110a, 110b, and 110c, may be disposed in front of the index module 120.

When a plurality of load port modules 110 are disposed in front of the index module 120, the containers SC on the load port modules 110 may contain different types of items. For example, when the first, second, and third load port modules 110a, 110b, and 110c are disposed in front of the index module 120, a first container SC1 placed on the first load port module 110a may contain wafer-type sensors, a second container SC2 placed on the second load port module 110b may contain semiconductor substrates, and a third container SC3 placed on the third load port module 110c may contain consumable parts such as focus rings, edge rings, etc.

However, the present disclosure is not limited to this. Alternatively, the first, second, and third containers SC1, SC2, and SC3 may contain items of the same type. Yet alternatively, some of the first, second, and third containers SC1, SC2, and SC3 may contain items of the same type, and the other containers may contain items of a different type.

The index module 120 may be disposed between the load port modules 110 and the load lock chambers 130 to function as an interface. The index module 120 may be provided as an interface that allows semiconductor substrates to travel between the containers SC on the load port modules 110 and the load lock chambers 130.

The index module 120 may include a first module housing 121 and a first transport robot 122. The first transport robot 122 is disposed within the first module housing 121 and may transport semiconductor substrates between the load port modules 110 and the load lock chambers 130. The internal environment of the first module housing 121 is provided at atmospheric pressure, allowing the first transport robot 122 to operate in an atmospheric pressure environment. A single first transport robot 122 may be provided within the first module housing 121, but the present disclosure is not limited thereto. Alternatively, a plurality of first transport robots 122 may be provided.

Although not illustrated in FIGS. 1 through 3, the index module 120 may also include a buffer chamber. The buffer chamber may temporarily store untreated substrates before transporting them to the load lock chambers 130. Also, the buffer chamber may temporarily store treated substrates before transporting them to the containers SC on the load port modules 110. The buffer chamber may be provided on an inner wall of the first module housing 121.

The semiconductor manufacturing equipment 100 may be provided as a front end module (FEM) into which the load port modules 110 and the index module 120 are integrated together. For example, the FEM may be provided as an equipment FEM (EFEM).

As previously described, a plurality of load port modules 110 may be provided within the semiconductor manufacturing equipment 100. Referring to the examples of FIGS. 1 through 3, the load port modules 110 may be arranged in a horizontal direction (e.g., a first direction D1), but the present disclosure is not limited thereto. Alternatively, the load port modules 110 may be stacked in a vertical direction (e.g., a third direction D3). In a case where the load lock chambers 110 are stacked vertically, the FEM may be provided as a vertically stacked EFEM.

The load lock chambers 130 may act as a buffer chamber between the input and output ports within the semiconductor manufacturing equipment 100. That is, the load lock chambers 130 may temporarily store untreated or treated substrates between the load port modules 110 and the process chambers 150. Although not illustrated in FIGS. 1 through 3, the load lock chambers 130 may include a buffer stage for temporarily storing semiconductor substrates.

A plurality of load lock chambers 130 may be disposed between the index module 120 and the transfer module 140. For example, two load lock chambers, i.e., first load lock chambers 130a and 130b, may be disposed between the index module 120 and the transfer module 140.

The load lock chambers 130 may be arranged in the same direction as the load port modules 110. Referring to the examples in FIGS. 1 through 3, the first and second load lock chambers 130a and 130b may be arranged in the same direction as the first, second, and third load port modules 110a, 110b, and 110c, i.e., in the horizontal direction (e.g., the first direction D1). The first and second load lock chambers 130a and 130b may be provided in a symmetrical single-layer structure where they are spaced apart from each other in the horizontal direction.

However, the present disclosure is not limited to this. Alternatively, the load lock chambers 130 may be arranged in a different direction from the load port modules 110. The first and second load lock chambers 130a and 130b may be arranged in the vertical direction (e.g., the third direction D3) between the index module 120 and the transfer module 140. The first and second load lock chambers 130a and 130b may be provided in a double-layer structure where they are spaced apart from each other in the vertical direction.

One of the first and second load lock chambers 130a and 130b may temporarily store untreated semiconductor substrates being transferred from the index module 120 to the transfer module 140, and the other load lock chamber may temporarily store treated semiconductor substrates being transferred from the transfer module 140 to the index module 120. However, the present disclosure is not limited to this.

The internal environments of the load lock chambers 130 may be altered between a vacuum environment and an atmospheric pressure environment using gate valves. Specifically, when the first transport robot 122, which is provided in the index module 120, loads or unloads semiconductor substrates into or from the load lock chambers 130, the load lock chambers 130 may provide an internal environment that is the same as or similar to the internal environment of the index module 120, which is an atmospheric environment. Additionally, when a second transport robot 142, which is provided in the transfer module 140, loads or unloads semiconductor substrates into or from the load lock chambers 130, the load lock chambers 130 may provide an internal environment that is the same as or similar to the internal environment of the transfer module 140, which is a vacuum environment. In this manner, the load lock chambers 130 may prevent changes in the internal pressure states of the index module 120 and the transfer module 140.

The transfer module 140 may be disposed between the load lock chambers 130 and the process chambers 150 to function as an interface. The transfer module 140 may be provided as an interface that allows semiconductor substrates to move back and forth between the load lock chambers 130 and the process chambers 150.

The transfer module 140 may include a second module housing 141 and the second transport robot 142. The second transport robot 142 is disposed within the second module housing 141 and may transport semiconductor substrates between the load lock chambers 130 and the process chambers 150. The internal environment of the second module housing 141 may be provided as a vacuum environment, and the second transport robot 142 may operate in the vacuum environment. A single second transport robot 142 may be provided within the second module housing 141, but the present disclosure is not limited thereto. Alternatively, a plurality of second transport robots 142 may be provided.

The transfer module 140 may be connected to a plurality of process chambers 150. For this, the second module housing 141 may have a plurality of sides, and the second transport robot 142 may be provided to be freely movable through each side of the second module housing 141 to load or unload semiconductor substrates into or from each of the process chambers 150.

The process chambers 150 treat semiconductor substrates. When untreated semiconductor substrates are provided, the process chambers 150 may process the semiconductor substrates and may supply the treated semiconductor substrates to the load lock chambers 130 via the transfer module 140. The process chambers 150 will be described later in further detail.

When the semiconductor manufacturing equipment 100 includes a plurality of process chambers 150, the semiconductor manufacturing equipment 100 may be formed with a cluster platform structure. For example, as illustrated in FIG. 1, the process chambers 150 may be arranged in a cluster manner around the transfer module 140, but the present disclosure is not limited thereto. Alternatively, when the semiconductor manufacturing equipment 100 includes a plurality of process chambers 150, the semiconductor manufacturing equipment 100 may be formed with a quad platform structure. For example, as illustrated in FIG. 2, the process chambers 150 may be arranged in a quad manner around the transfer module 140. Yet alternatively, when the semiconductor manufacturing equipment 100 includes a plurality of process chambers 150, the semiconductor manufacturing equipment 100 may be formed with an in-line platform structure. For example, as illustrated in FIG. 3, the process chambers may be arranged in an in-line manner around the transfer module 140, and two different process chambers 150 may be arranged in series on either side of the transfer module 140.

Although not illustrated in FIGS. 1 through 3, the semiconductor manufacturing equipment 100 may further include a control device. The control device controls the overall operation of each component of the semiconductor manufacturing equipment 100. For example, the control device may control the transport of semiconductor substrates by the first transport robot 122 or the second transport robot 142, control changes in the internal environment of the load lock chambers 130, and control the treatment of substrates by the process chambers 150.

The control device may include one or more modules related to functions or operations for controlling each component of the semiconductor manufacturing equipment 100. These modules may be provided in the form of applications or programs and may be implemented through instructions stored on a computer-readable storage medium (e.g., a hard disk, a portable disk such as a CD-ROM or DVD, a semiconductor memory such as a flash memory, etc.). When these instructions are executed by a processor, the processor may perform functions corresponding to the instructions. The instructions may include code generated by a compiler or code that can be executed by an interpreter. The control device may be configured as a computing device that communicates with each component of the semiconductor manufacturing equipment 100 via a wired or wireless network for information processing, data provision, etc.

The process chambers 150 will hereinafter be described. The surfaces of the process chambers 150 may be formed of alumite with an anodic oxide film, and the inside of the process chambers 150 may be configured to be hermetically sealed. A plurality of process chambers 150 may be provided within the semiconductor manufacturing equipment 100, and the process chambers 150 may be spaced apart from one another around the circumference of the transfer module 140. However, the present disclosure is not limited to this. Alternatively, a single process chamber 150 may be provided within the semiconductor manufacturing equipment 100. The process chambers 150 may be provided in a cylindrical shape, but the present disclosure is not limited thereto. The process chambers 150 may also be provided in other shapes.

As previously mentioned, the process chambers 150 may treat semiconductor substrates. The internal configuration of the process chambers 150 will hereinafter be described, assuming that the process chambers 150 are substrate treating apparatuses.

Figure 4:
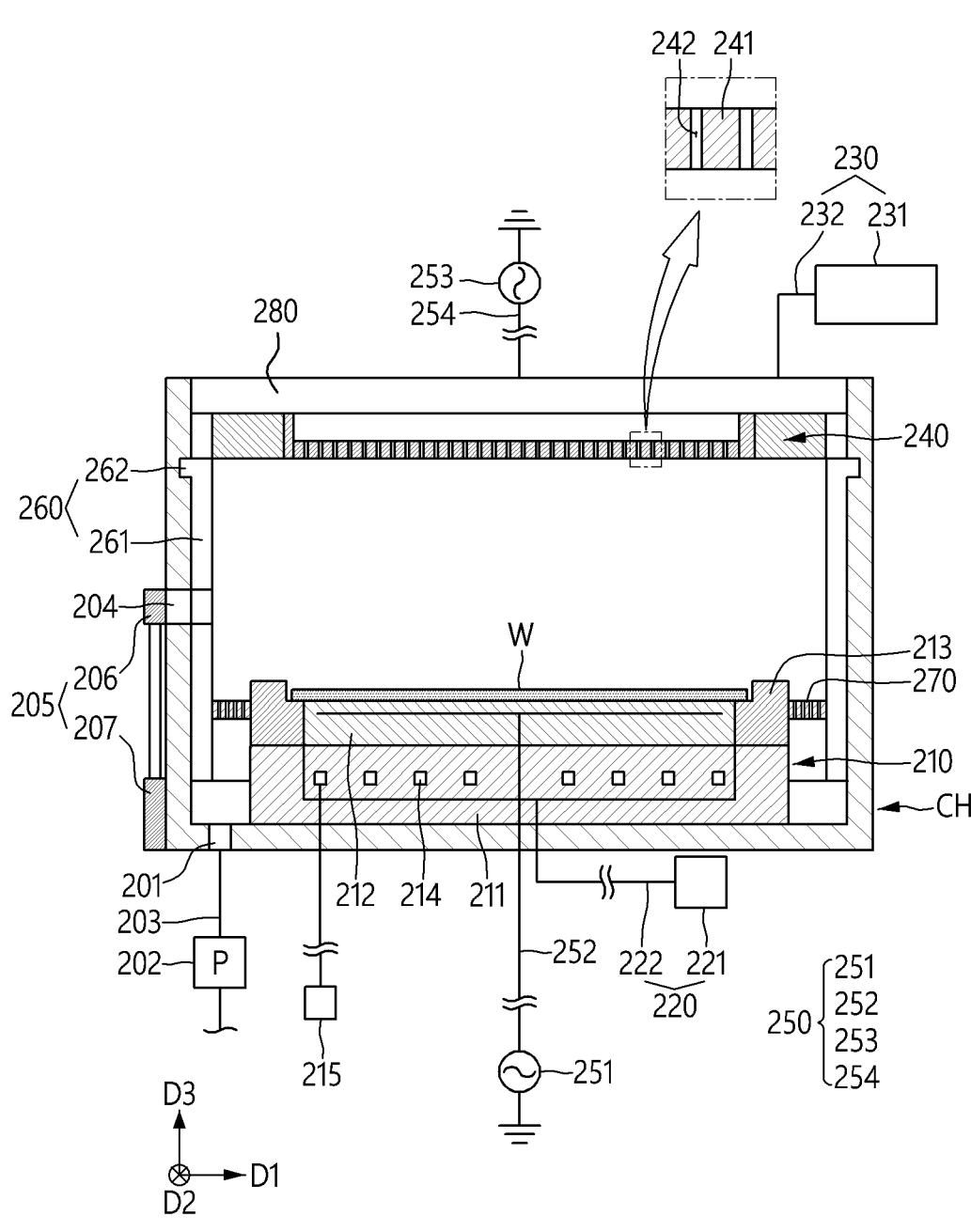
FIG. 4 is a first exemplary cross-sectional view illustrating the internal configuration of a substrate treating apparatus that constitutes the semiconductor manufacturing equipment.

FIG. 4 is a cross-sectional view illustrating the internal configuration of a substrate treating apparatus that constitutes the semiconductor manufacturing equipment. Referring to FIG. 4, a substrate treating apparatus 200 may be configured to include a chamber housing CH, a substrate support unit 210, a cleaning gas supply unit 220, a process gas supply unit 230, a showerhead unit 240, a plasma generation unit 250, a liner unit 260, a baffle unit 270, and an antenna unit 280.

The substrate treating apparatus 200 may treat a semiconductor substrate W using plasma. The substrate treating apparatus 200 may treat the semiconductor substrate W using a dry method. The substrate treating apparatus 200 may treat the semiconductor substrate W in a vacuum environment. The substrate treating apparatus 200 may treat the semiconductor substrate W using a deposition process, an etching process, a cleaning process, etc.

The substrate treating apparatus 200 may include all the units illustrated in FIG. 4, but the present disclosure is not limited thereto. Alternatively, the substrate treating apparatus 200 may not include some of the units illustrated in FIG. 4.

The chamber housing CH provides a space where a process of treating the semiconductor substrate W using plasma, i.e., a plasma process, takes place. The chamber housing CH may be equipped with an exhaust hole 201 at its lower part.

The exhaust hole 201 may be connected to an exhaust line 203, which is equipped with a pump 202. The exhaust hole 201 may discharge reaction byproducts generated during the plasma process and residual gases within the chamber housing CH to the outside of the chamber housing CH via the exhaust line 203. In this case, the internal space of the chamber housing CH may be depressurized.

An opening 204 may be formed by penetrating a sidewall of the chamber housing CH. The opening 204 may be provided as a passage for the semiconductor substrate W to enter and exit the interior of the chamber housing CH. For example, the opening 204 may be configured to be opened and closed automatically by a door assembly 205.

The door assembly 205 may be configured to include an outer door 206 and a door actuator 207. The outer door 206 may open and close the opening 204 from an outer wall of the chamber housing CH. The outer door 206 may be movable in the height direction (or the third direction D3) of the substrate treating apparatus 200 under the control of the door actuator 207. The door actuator 207 may operate using at least one element selected from among a motor, a hydraulic cylinder, and a pneumatic cylinder.

The substrate support unit 210 is installed in a lower area within the chamber housing CH. The substrate support unit 210 may use an electrostatic force to attract and support the semiconductor substrate W. The substrate support unit 210 may be configured as, for example, an electrostatic chuck (ESC), but the present disclosure is not limited thereto. Alternatively, the substrate support unit 210 may use various other methods such as vacuum, mechanical clamping, etc., to support the semiconductor substrate W.

When the substrate support unit 210 uses an electrostatic force to support the semiconductor substrate W, the substrate support unit 210 may be configured to include a base plate 211 and a dielectric layer 212.

The base plate 211 may be formed of a material with excellent corrosion and heat resistance. For example, the base plate 211 may be provided as an aluminum body.

The dielectric layer 212 may be disposed on the base plate 211. For example, the dielectric layer 212 may be formed of a ceramic material.

A focus ring 213 is provided to surround the outer edge area of the dielectric layer 212. When a plasma process is performed within the chamber housing CH, the focus ring 213 may serve to concentrate radical ions onto the semiconductor substrate W. The focus ring 213 may be formed of a silicon material.

Although not illustrated in FIG. 4, the substrate support unit 210 may further include an edge ring, which surrounds the outer area of the focus ring 213. A ring assembly including the focus ring 213 and the edge ring may be provided in the outer edge area of the dielectric layer 212. The edge ring may serve to prevent the side of the dielectric layer 212 from being damaged by plasma. The edge ring may be formed of an insulating material. For example, the edge ring may be formed of quartz.

Cooling elements 214 are provided to maintain the semiconductor substrate W at a process temperature when a substrate treatment process (i.e., a plasma process) is performed within the chamber housing CH. The cooling elements 214 may be provided as cooling lines through which a refrigerant flows to lower the temperature of the semiconductor substrate W. The cooling elements 214 may be installed within the base plate 211. The cooling elements 214 may be installed across both the base plate 211 and the dielectric layer 212. The cooling elements 214 may receive a refrigerant from a separate cooling device, i.e., a chiller 215, which is provided outside the substrate treating apparatus 200. The refrigerant may include, for example, a coolant and/or a helium gas.

Figure 5:
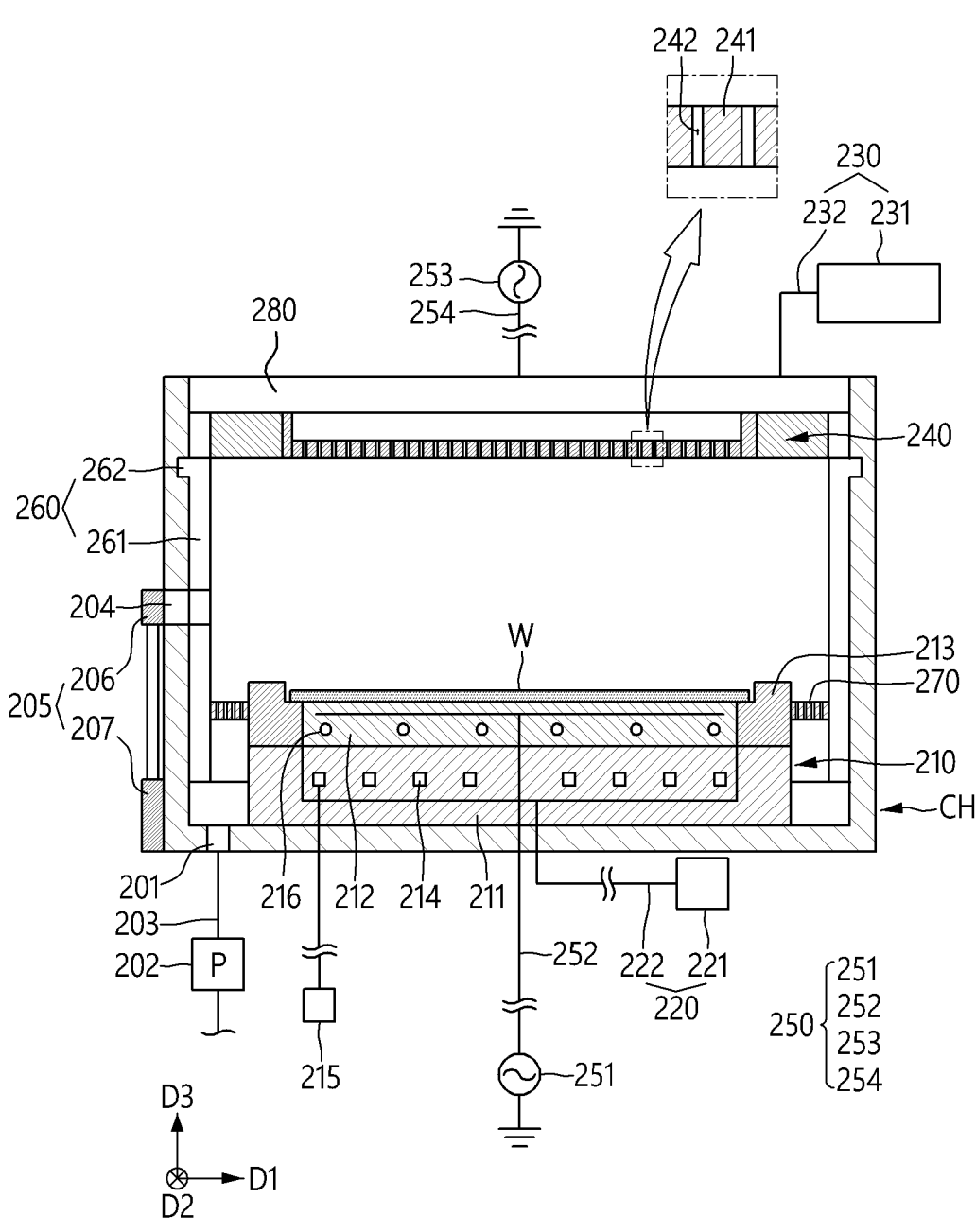
FIG. 5 is a second exemplary cross-sectional view illustrating the internal configuration of the substrate treating apparatus that constitutes the semiconductor manufacturing equipment.

The substrate support unit 210 may also include heating elements 216 in addition to the cooling elements 214 to maintain the semiconductor substrate W at a process temperature. Referring to FIG. 5, the heating elements 216 may be provided as heating wires to raise the temperature of the semiconductor substrate W. The heating elements 216 may be installed within the dielectric layer 212. FIG. 5 is a second exemplary cross-sectional view illustrating the internal configuration of the substrate treating apparatus that constitutes the semiconductor manufacturing equipment.

Referring back to FIG. 4, the cleaning gas supply unit 220 provides a cleaning gas to the dielectric layer 212 or the focus ring 213 to remove any residual foreign material on the dielectric layer 212 or the focus ring 213. For example, the cleaning gas supply unit 220 may provide a nitrogen ($N_2$) gas as the cleaning gas.

The cleaning gas supply unit 220 may include a cleaning gas supply source 221 and a cleaning gas supply line 222. The cleaning gas supply line 222 may be connected to the space between the dielectric layer 212 and the focus ring 213. The cleaning gas supplied by the cleaning gas supply source 221 may move through the cleaning gas supply line 222 into the space between the dielectric layer 212 and the focus ring 213 to remove any foreign material that remains on the edge of the dielectric layer 212 or the top of the focus ring 213.

The process gas supply unit 230 provides a process gas into the chamber housing CH. The process gas supply unit 230 may provide the process gas through a hole formed to penetrate a top cover of the chamber housing CH, i.e., a window module WM, but the present disclosure is not limited thereto. Alternatively, the process gas supply unit 230 may provide the process gas through a hole formed to penetrate a sidewall of the chamber housing CH.

The process gas supply unit 230 may include a process gas supply source 231 and a process gas supply line 232. The process gas supply source 231 may provide a gas used for treating the semiconductor substrate W as the process gas. A single process gas supply source 231 may be provided within the substrate treating apparatus 200, but the present disclosure is not limited thereto. Alternatively, a plurality of process gas supply sources 231 may be provided within the substrate treating apparatus 200. In this case, the plurality of process gas supply sources 231 may provide the same type of process gas or different types of process gases.

The showerhead unit 240 sprays the process gas provided from the process gas supply source 231 over the entire area on the semiconductor substrate W located in the internal space of the chamber housing CH. The showerhead unit 240 may be connected to the process gas supply source 231 through the process gas supply line 232.

The showerhead unit 240 is disposed in the internal space of the chamber housing CH and may include a unit body 241 and a plurality of gas feeding holes 242. The gas feeding holes 242 may be formed to penetrate the surface of the unit body 241 in the vertical direction (e.g., the third direction D3). The gas feeding holes 242 may be spaced apart from one another at regular intervals on the surface of the unit body 241. The showerhead unit 240 may uniformly spray the process gas through the gas feeding holes 242 over the entire area of the semiconductor substrate W.

The showerhead unit 240 may be installed in the chamber housing CH to face the substrate support unit 210 in the vertical direction (e.g., the third direction D3). The showerhead unit 240 may be provided with a larger diameter than the dielectric layer 212, but the present disclosure is not limited thereto. Alternatively, the showerhead unit 240 may be provided with the same diameter as the dielectric layer 212. The showerhead unit 240 may be formed of silicon as the material, but the present disclosure is not limited thereto. Alternatively, the showerhead unit 240 may be formed of a metal.

Although not illustrated in FIG. 4, the showerhead unit 240 may be divided into a plurality of modules. For example, the showerhead unit 240 may be divided into three modules, i.e., first, second, and third modules. The first module may be disposed at a position corresponding to a central zone of the semiconductor substrate W. The second module may be disposed to surround the outer edge of the first module. The second module may be disposed at a position corresponding to a middle zone of the semiconductor substrate W. The third module may be disposed to surround the outer edge of the second module. The third module may be disposed at a position corresponding to an edge zone of the semiconductor substrate W.

Although not illustrated in FIG. 4, when the showerhead unit 240 is divided into a plurality of modules, the process gas supply unit 230 may further include a process gas distributor and a process gas distribution line to distribute the process gas to each of the modules of the showerhead unit 240. The process gas distributor may be installed on the process gas supply line 232, and the process gas distribution line may distribute the process gas supplied from the process gas supply source 231 to each of the modules of the showerhead unit 240. The process gas distribution line may be a part of the process gas supply line 232 and may connect the process gas distributor to each of the modules of the showerhead unit 240.

The plasma generation unit 250 generates plasma from the gas remaining in a discharge space. The discharge space may be the internal space of the chamber housing CH and may be formed between the showerhead unit 240 and the window module WM. Alternatively, the discharge space may be formed between the substrate support unit 210 and the showerhead unit 240. If the discharge space includes both the space formed between the showerhead unit 240 and the window module WM and the space formed between the substrate support unit 210 and the showerhead unit 240, the space formed between the showerhead unit 240 and the window module WM may be a plasma region. The space formed between the substrate support unit 210 and the showerhead unit 240 may be a process region. If the discharge space only includes the space formed between the substrate support unit 210 and the showerhead unit 240, the discharge space may be divided into the plasma region and the process region. The plasma region may be formed on a higher level than the process region.

The plasma generation unit 250 may generate plasma in the discharge space using an inductively coupled plasma (ICP) source. For example, the plasma generation unit 250 may generate plasma in the discharge space using the substrate support unit 210 and the antenna unit 280 as a first electrode (or a lower electrode) and a second electrode (or an upper electrode), respectively. In this case, the second electrode may have a higher potential than the first electrode. The first electrode may form a cathode, and the second electrode may form an anode.

The plasma generation unit 250 may be configured to include a first high-frequency power source 251, a first transmission line 252, a second high-frequency power source 253, and a second transmission line 254.

The first high-frequency power source 251 applies radio frequency (RF) power to the first electrode. The first high-frequency power source 251 may serve as a plasma source to generate plasma within the chamber housing CH. A single first high-frequency power source 251 may be provided within the substrate treating apparatus 200, but the present disclosure is not limited thereto. Alternatively, a plurality of first high-frequency power sources 251 may be provided within the substrate treating apparatus 200, in which case, the plurality of first high-frequency sources 251 may be arranged in parallel on the first transmission line 252.

When a plurality of first high-frequency power sources 251 are provided within the substrate treating apparatus 200, the plasma generation unit 250 may include a first matching network, which is electrically connected to each of the plurality of first high-frequency power sources 251. If frequency powers with different magnitudes are input from the plurality of first high-frequency power sources 251, the first matching network may match and apply the frequency powers to the first electrode.

The first transmission line 252 may connect the first electrode and a ground source. The first high-frequency power source 251 may be installed on the first transmission line 252, but the present disclosure is not limited thereto. The first transmission line 252 may also connect the first electrode and the first high-frequency power source 251. For example, the first transmission line 252 may be provided as an RF rod.

Although not illustrated in FIG. 4, a first impedance matching circuit for impedance matching may be provided on the first transmission line 252, which connects the first high-frequency power source 251 and the first electrode. The first impedance matching circuit may function as a lossless passive circuit and may enable maximum electrical energy to be transferred from the first high-frequency power source 251 to the first electrode.

The second high-frequency power source 253 applies RF power to the second electrode. The second high-frequency power source 253 may control the plasma characteristics within the chamber housing CH. For example, the second high-frequency power source 253 may adjust the ion bombardment energy within the chamber housing CH. A single second high-frequency power source 253 may be provided within the substrate treating apparatus 200, but the present disclosure is not limited thereto. Alternatively, a plurality of second high-frequency power sources 253 may be provided within the substrate treating apparatus 200, in which case, the plurality of second high-frequency power sources 253 may be arranged in parallel on the second transmission line 254.

When a plurality of second high-frequency power sources 253 are provided within the substrate treating apparatus 200, the plasma generation unit 250 may include a second matching network, which is electrically connected to each of the plurality of second high-frequency power sources 253. If frequency powers with different magnitudes are input from the plurality of second high-frequency power sources 253, the second matching network may match and apply the frequency powers to the second electrode.

The second transmission line 254 may connect the first electrode and the ground source. The second high-frequency power source 253 may be installed on the second transmission line 254.

Although not illustrated in FIG. 4, a second impedance matching circuit for impedance matching may be provided on the second transmission line 254, which connects the second high-frequency power source 253 and the second electrode. The second impedance matching circuit may function as a lossless passive circuit and may enable maximum electrical energy to be transferred from the second high-frequency power source 253 to the second electrode.

The second high-frequency power source 253, like the first high-frequency power source 251, may control the plasma characteristics within the chamber housing CH.

The liner unit 260, also referred to as a wall liner, protects the interior of the chamber housing CH from arc discharges generated during the excitation of the process gas or from impurities produced during the treatment of the semiconductor substrate W. The liner unit 260 may be formed to cover the inner walls of the chamber housing CH.

The liner unit 260 may include a unit body 261 and a support ring 262, which is formed on the unit body 261. The support ring 262 may protrude in an outward direction (e.g., the first direction D1) from an upper part of the unit body 261 and may secure the unit body 261 to the chamber housing CH.

The baffle unit 270 discharges unreacted gases and byproducts from the plasma process within the chamber housing CH. The baffle unit 270 may be installed in the space between the substrate support unit 210 and the inner walls of the chamber housing CH (or the liner unit 260), adjacent to the exhaust hole 201. The baffle unit 270 may be provided in a ring shape in the space between the substrate support unit 210 and the inner walls of the chamber housing CH.

The baffle unit 270 may include a plurality of slot holes, which penetrate the unit body of the baffle unit 270 in the vertical direction (or the third direction D3) to control the flow of the process gas within the chamber housing CH. To minimize damage or alteration caused by radicals in the space where plasma is generated within the chamber housing CH, the baffle unit 270 may be formed of a material with etch resistance. For example, the baffle unit 270 may be formed of quartz.

The antenna unit 280 generates magnetic and electric fields within the chamber housing CH to excite the process gas into plasma. The antenna unit 280 may operate using the RF power supplied from the second high-frequency power source 253. The antenna unit 280 may be arranged to cover an upper part of the chamber housing CH.

Figure 6:
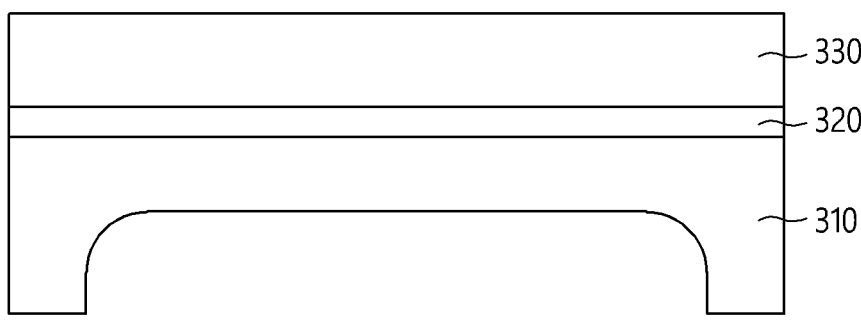
FIG. 6 is a first exemplary schematic view illustrating the configuration of an antenna unit that constitutes the substrate treating apparatus.
Figure 6:
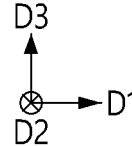

Referring to FIG. 6, the antenna unit 280 may be configured to include a first dielectric module 310, an antenna module 320, and a second dielectric module 330, but the present disclosure is not limited thereto. Alternatively, the antenna unit 280 may only include the antenna module 320. FIG. 6 is a first exemplary schematic view illustrating the configuration of the antenna unit 280 that constitutes the substrate treating apparatus 200.

The first dielectric module 310 may directly cover the upper part of the chamber housing CH. The first dielectric module 310 may also cover the upper part of the shower head unit 240 and may cover the plasma region. In this case, the first dielectric module 310 may cover only a portion of the upper part of the chamber housing CH and may be surrounded by the chamber housing CH, but the present disclosure is not limited thereto. Alternatively, the first dielectric module 310 may cover the entire upper part of the chamber housing CH.

The first dielectric module 310 may be formed of an insulating material. For example, the first dielectric module 310 may include quartz or alumina (Al$_2$O$_3$), and may be configured as a dielectric window with a predetermined dielectric constant. When viewed in the vertical direction (or the third direction D3), the first dielectric module 310 may have a cylindrical cross-sectional shape, but the present disclosure is not limited thereto. That is, the shape of the first dielectric module 310 may vary depending on the overall shape of the substrate treating apparatus 200. Additionally, when viewed in the horizontal direction (or the first direction D1 or a second direction D2), the first dielectric module 310 may be formed in a dome-type structure, but the present disclosure is not limited thereto. Alternatively, the first dielectric module 310 may be formed in a plate-type structure.

The antenna module 320 may be disposed on the first dielectric module 310. The antenna module 320 may be formed to have the same width as the first dielectric module 310. For example, if the first dielectric module 310 is formed to be surrounded by the chamber housing CH, the antenna module 320 may also be surrounded by the chamber housing CH.

However, the present disclosure is not limited to this. Alternatively, the antenna module 320 may also be formed to have a different width from the first dielectric module 310. For example, the antenna module 320 may be formed to have a smaller width than the first dielectric module 310. In this example, the antenna module 320 may be surrounded by at least one of the first and second dielectric modules 310 and 330.

Figure 7:
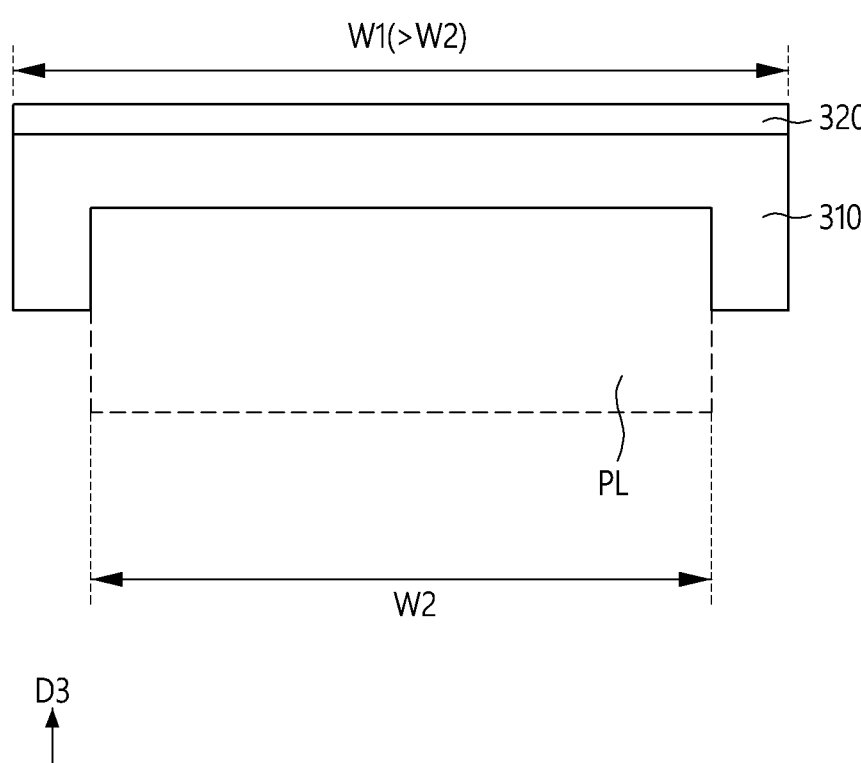
FIG. 7 is a first exemplary schematic view illustrating the relationship between an antenna module of the antenna unit and a plasma region.

To generate plasma across the entire plasma region, the width of the antenna module 320 may be determined based on the width of the plasma region. Referring to FIG. 7, a width W1 of the antenna module 320 may be greater than a width W2 of a plasma region PL in the horizontal direction (e.g., the first or second direction D1 or D2), i.e., W1>W2. In this case, the antenna module 320 may be formed to have the same width as the first dielectric module 310, but the present disclosure is not limited thereto. Alternatively, the antenna module 320 may be formed to have a smaller width than the first dielectric module 310. FIG. 7 is a first exemplary schematic view illustrating the relationship between the antenna module of the antenna unit and the plasma region.

Figure 8:
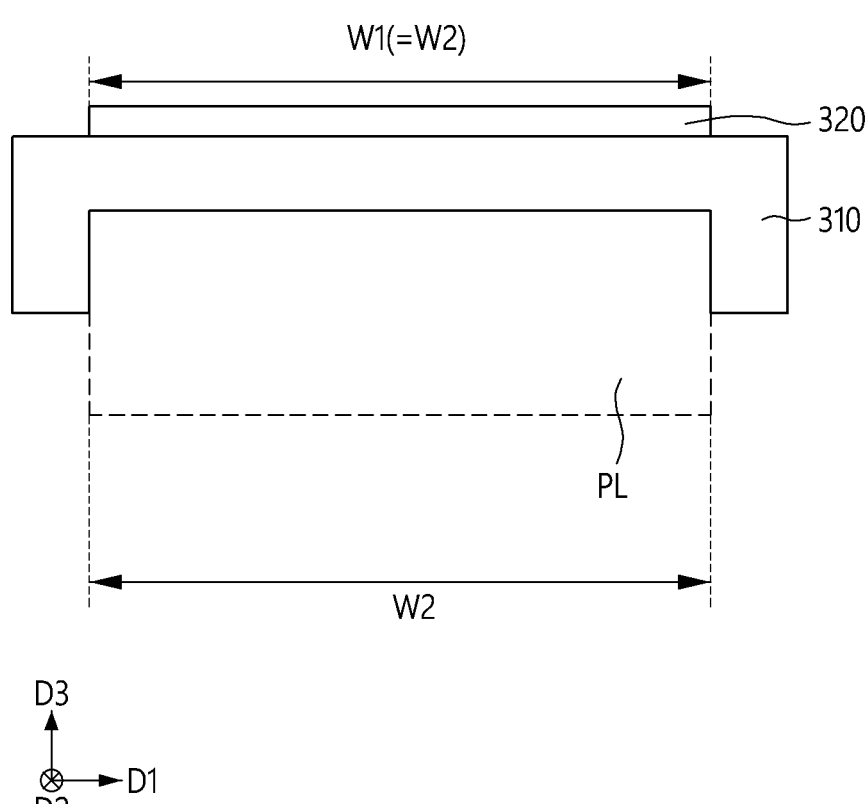
FIG. 8 is a second exemplary schematic view illustrating the relationship between the antenna module of the antenna unit and the plasma region.

Alternatively, referring to FIG. 8, the width W1 of the antenna module 320 may be the same as the width W2 of the plasma region PL in the horizontal direction, i.e., W1=W2. In this case, the antenna module 320 may be formed to have a smaller width than the first dielectric module 310. FIG. 8 is a second exemplary schematic view illustrating the relationship between the antenna module of the antenna unit and the plasma region.

The antenna module 320 may be formed of a conductive material. The antenna module 320 may be formed of a first metal with conductivity, but the present disclosure is not limited thereto. Alternatively, the antenna module 320 may be formed by plating or coating the surface of a base material formed of a second metal with the first metal. The antenna module 320 may be formed in a cylindrical waveguide structure, but the shape of the antenna module 320 may vary depending on the overall shape of the substrate treating apparatus 200.

Figure 9:
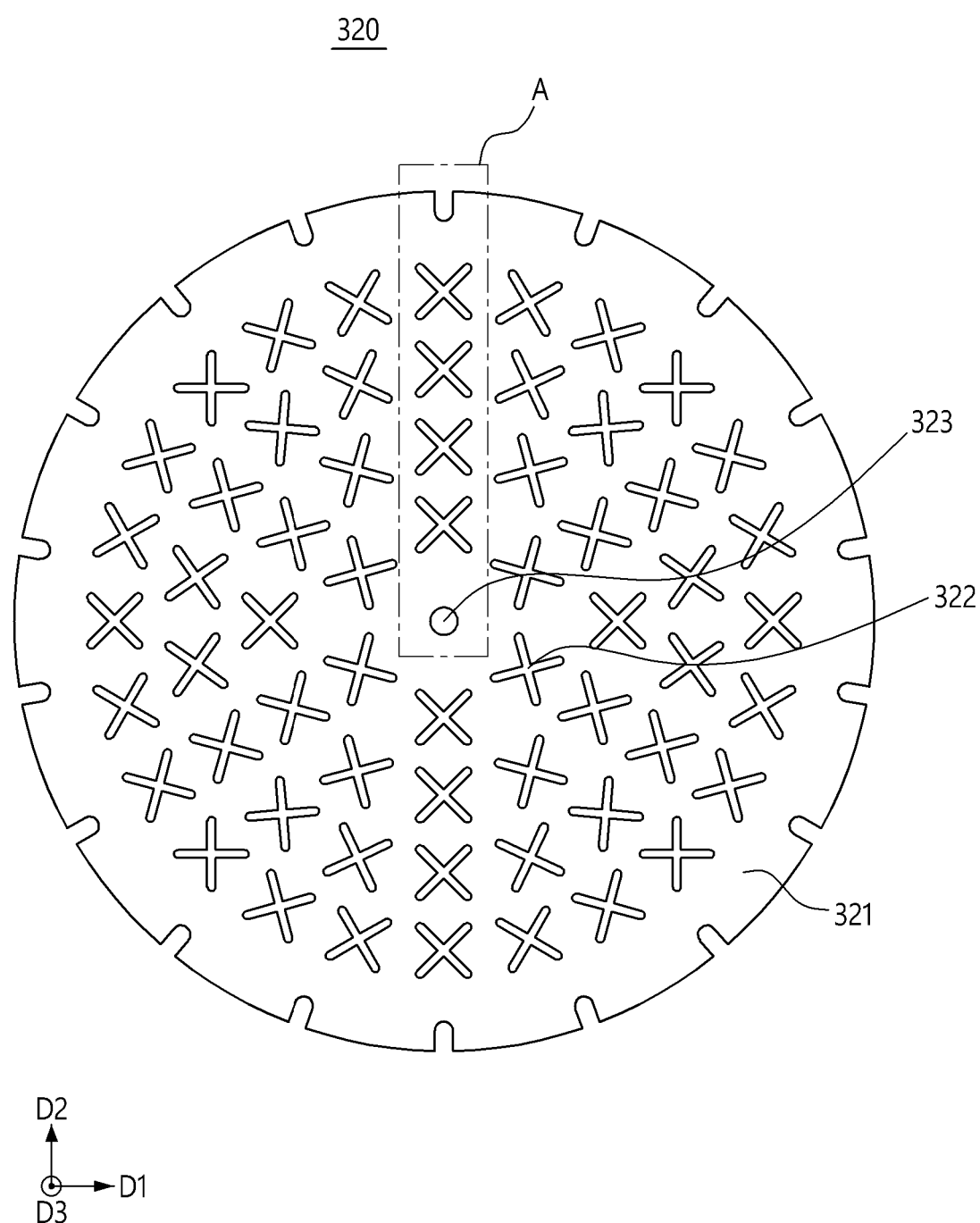
FIG. 9 is an exemplary schematic view illustrating the configuration of the antenna module of the antenna unit.

The antenna module 320 may include a plurality of slot pairs on the surface of a waveguide. In other words, the antenna module 320 may be configured as a slot antenna. For example, the antenna module 320 may be configured as an RLSA. Referring to FIG. 9, a plurality of slot pairs 322 may be radially arranged from a central region 323 of the slot plate 321. The slot pairs 322 may be arranged in a concentric circular fashion around the central region 323 of the slot plate 321. FIG. 9 is an exemplary schematic view illustrating the configuration of the antenna module of the antenna unit.

Figure 10:
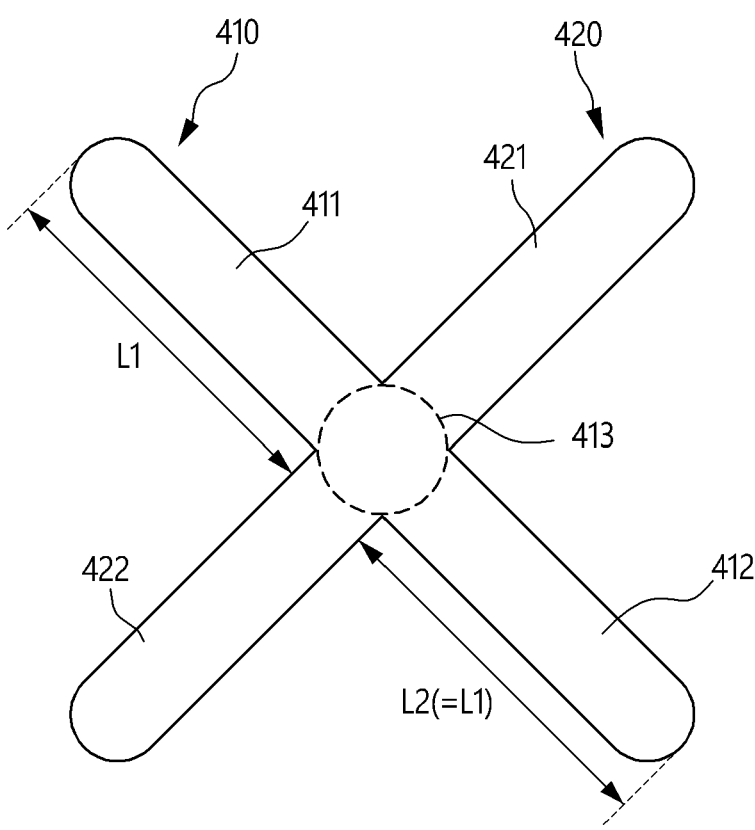
FIG. 10 is a first exemplary schematic view illustrating the shape of each slot pair that constitutes the antenna module.
Figure 10:
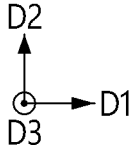
Figure 11:
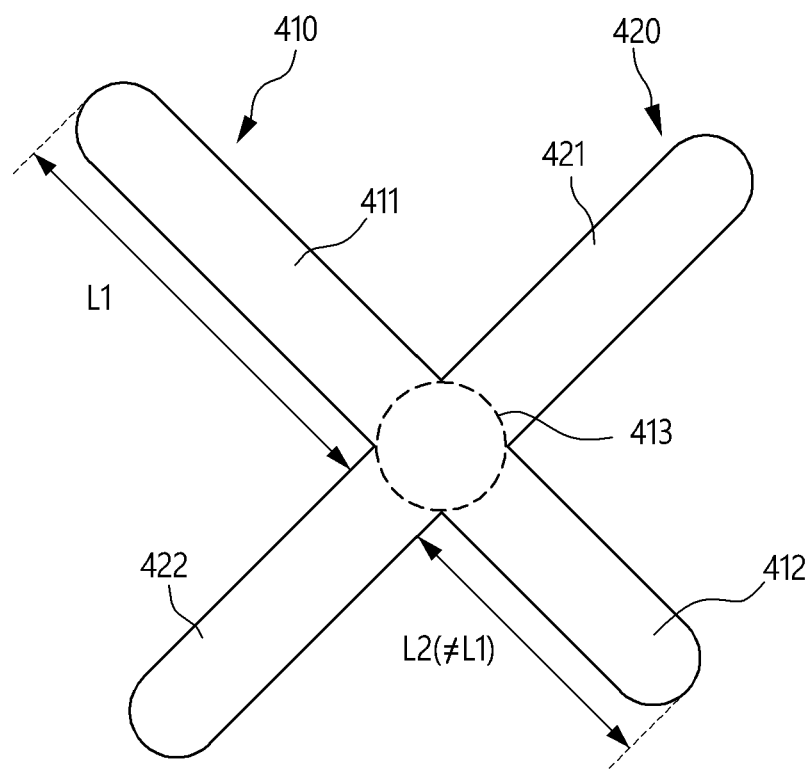
FIG. 11 is a second exemplary schematic view illustrating the shape of each slot pair that constitutes the antenna module.

Referring to FIGS. 10 and 11, a slot pair 322 may consist of two slots, i.e., first and second slots 410 and 420. The first and second slots 410 and 420 may intersect with each other.

The first slot 410 may be divided into first and second portions 411 and 412 based on an intersection point 413 between the first and second slots 410 and 420. The first portion 411 may be positioned on one side of the intersection point 413. The second portion 412 may be positioned on the other side of the intersection point 413.

Referring to FIG. 10, a length L1 of the first portion 411 may be equal to a length L2 of the second portion 412, i.e., L1=L2. Alternatively, referring to FIG. 11, the length L1 of the first portion 411 may differ from the length L2 of the second portion 412, i.e., L1≠L2. For example, the length L1 of the first portion 411 may be relatively greater than the length L2 of the second portion 412, i.e., L1>L2, but the present disclosure is not limited thereto. Alternatively, the length L1 of the first portion 411 may be relatively smaller than the length L2 of the second portion 412, i.e., L1<L2. FIG. 10 is a first exemplary schematic view illustrating the shape of each slot pair that constitutes the antenna module, and FIG. 11 is a second exemplary schematic view illustrating the shape of each slot pair that constitutes the antenna module.

Referring to FIGS. 10 and 11, the second slot 420 may be divided into third and fourth portions 421 and 422 based on the intersection point 413. The third portion 421 may be positioned on one side of the intersection point 413. The fourth portion 422 may be positioned on the other side of the intersection point 413.

Although not illustrated in FIGS. 10 and 11, the length of the third portion 421 may be the same as the length of the fourth portion 422. Alternatively, the length of the third portion 421 may differ from the length of the fourth portion 422.

Figure 12:
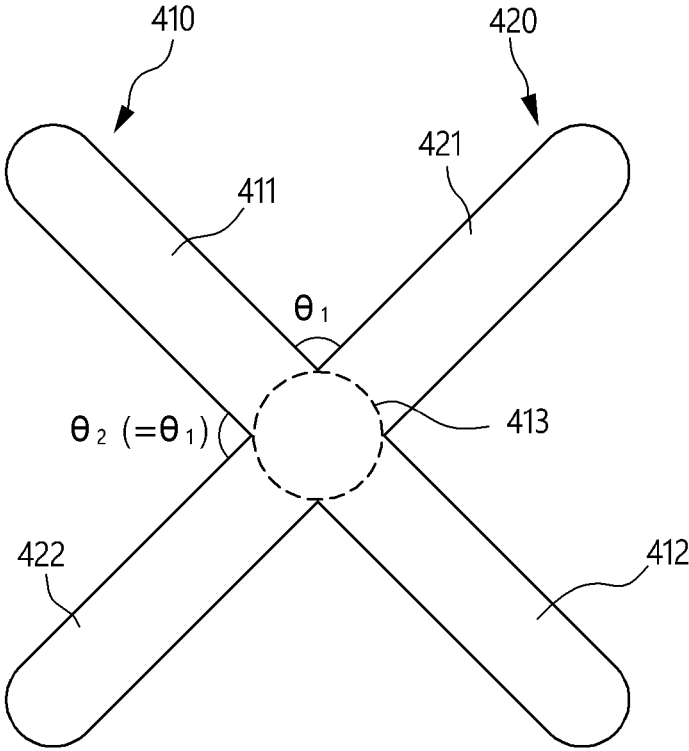
FIG. 12 is a third exemplary schematic view illustrating the shape of each slot pair that constitutes the antenna module.
Figure 12:
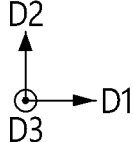

Referring to FIG. 12, when the first and second slots 410 and 420 intersect with each other, an angle θ1 formed between the first portion 411 of the first slot 410 and the third portion 421 of the second slot 420 may be the same as an angle θ2 formed between the first portion 411 of the first slot 410 and the fourth portion 422 of the second slot 420, i.e., θ1=θ2. FIG. 12 is a third exemplary schematic view illustrating the shape of each slot pair that constitutes the antenna module.

Figure 13:
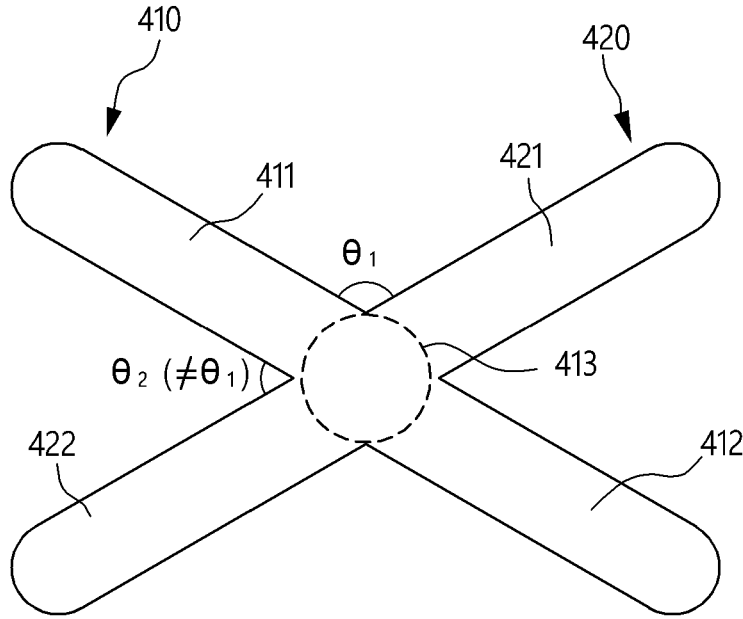
FIG. 13 is a fourth exemplary schematic view illustrating the shape of each slot pair that constitutes the antenna module.
Figure 13:
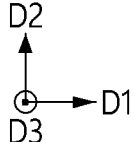

Alternatively, referring to FIG. 13, the angle θ1 may differ from the angle θ2, i.e., θ1/θ2. For example, the angle θ1 may be relatively greater than the angle θ2, i.e., θ1>θ2, but the present disclosure is not limited thereto. Alternatively, the angle θ1 may be relatively smaller than the angle θ2, i.e., θ1<θ2. FIG. 13 is a fourth exemplary schematic view illustrating the shape of each slot pair that constitutes the antenna module.

A case where each of the slot pairs 322, which are formed in the slot plate 321, consists of two slots has been described so far, but the present disclosure is not limited thereto. Alternatively, each of the slot pairs 322 may consist of three or more slots.

Figure 14:
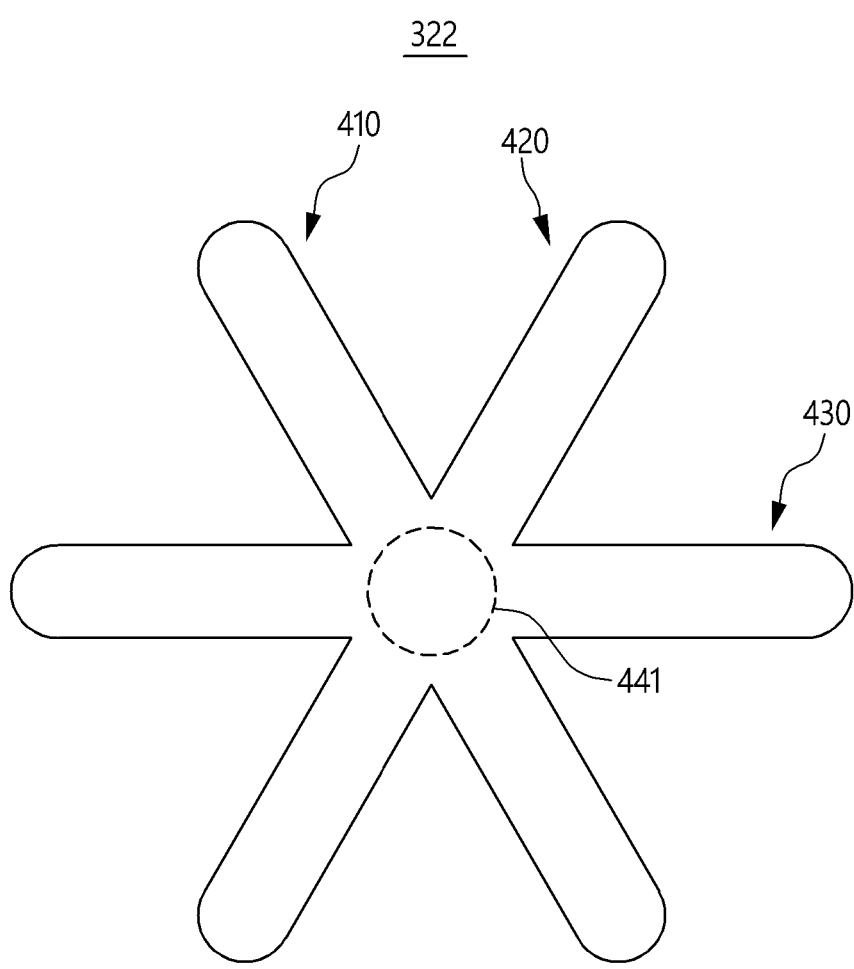
FIG. 14 is a fifth exemplary schematic view illustrating the shape of each slot pair that constitutes the antenna module.
Figure 14:
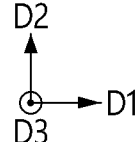

Referring to FIG. 14, each slot pair 322 may consist of three slots, i.e., first, second, and third slots 410, 420, and 430. The first, second, and third slots 410, 420, and 430 may intersect with one another. The first, second, and third slots 410, 420, and 430 may intersect with one another at a single intersection point 441. FIG. 14 is a fifth exemplary schematic view illustrating the shape of each slot pair that constitutes the antenna module.

Figure 15:
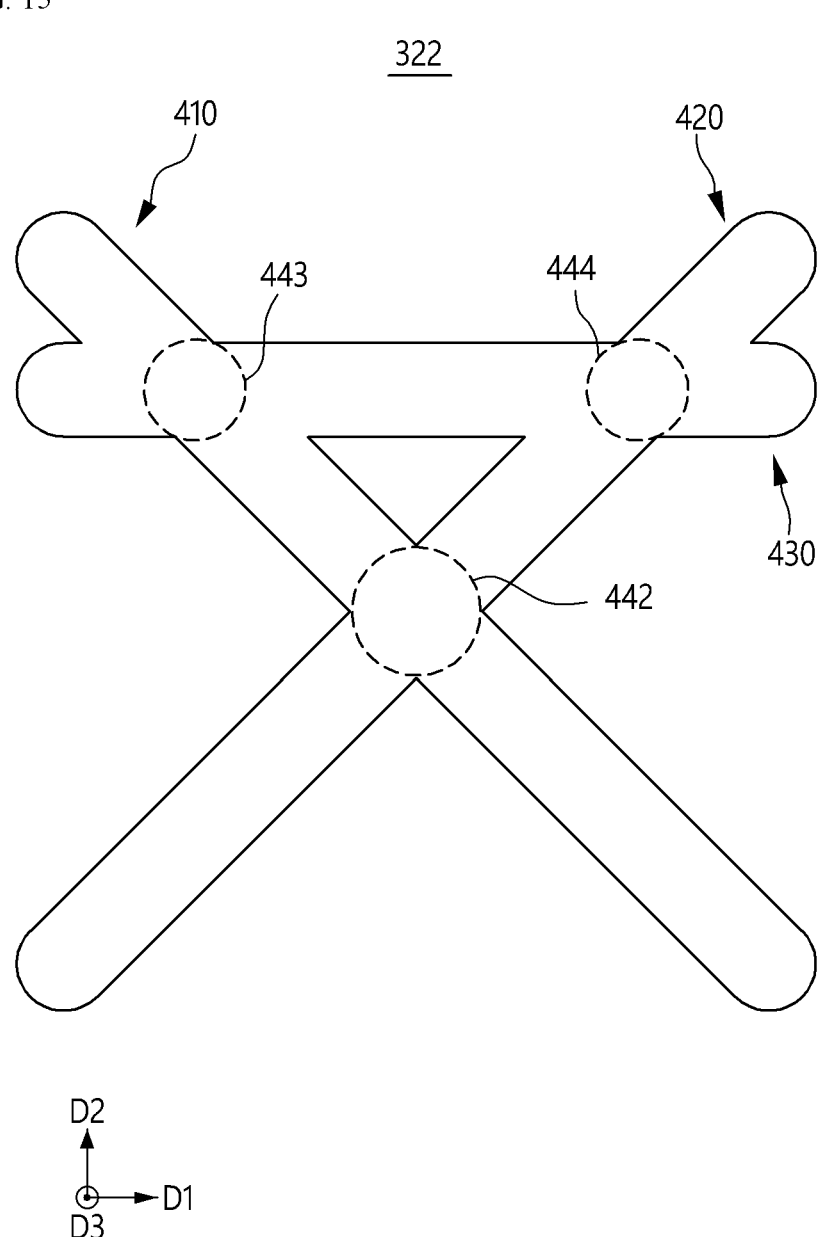
FIG. 15 is a sixth exemplary schematic view illustrating the shape of each slot pair that constitutes the antenna module.

The first, second, and third slots 410, 420, and 430 may intersect with one another at a plurality of intersection points. Referring to FIG. 15, the first, second, and third slots 410, 420, and 430 may intersect with one another at three intersection points, i.e., first, second, and third intersection points 442, 443, and 444. None of the first, second, and third intersection points 442, 443, and 444 are provided as common intersection points for all the first, second, and third slots 410, 420, and 430. The intersection point 442 serves as an intersection point between the first and second slots 410 and 420, the second intersection point 443 serves as an intersection point between the first and third slots 410 and 430, and the third intersection point 444 serves as an intersection point between the second and third slots 420 and 430. FIG. 15 is a sixth exemplary schematic view illustrating the shape of each slot pair that constitutes the antenna module.

Figure 16:
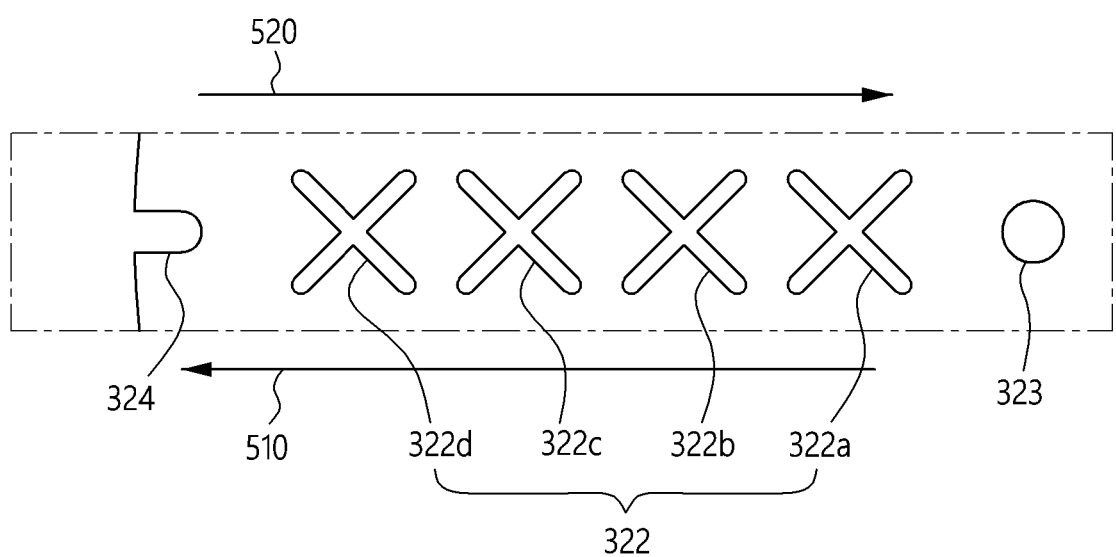
FIG. 16 is a first exemplary schematic view illustrating the arrangement structure of a plurality of slot pairs in the slot plate that constitutes the antenna module.
Figure 16:
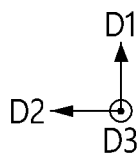

The slot pairs 322, which are formed in the slot plate 321, may be arranged to have a predetermined shape with respect to the direction of propagating waves and/or the direction of reflected waves. Referring to FIG. 16, when each of first, second, third, and fourth slot pairs 322a, 322b, 322c, and 322d consists of two slots, i.e., first and second slots 410 and 420, the first, second, third, and fourth slot pairs 322a, 322b, 322c, and 322d may be arranged to form an X shape with respect to the direction of a propagating wave 510 and the direction of a reflected wave 520. That is, the first, second, third, and fourth slot pairs 322a, 322b, 322c, and 322d may be arranged in a linear X shape from the central area 323 of the slot plate 321 toward the edge of the slot plate 321. FIG. 16 is a first exemplary schematic view illustrating the arrangement structure of a plurality of slot pairs in the slot plate that constitutes the antenna module.

Figure 17:
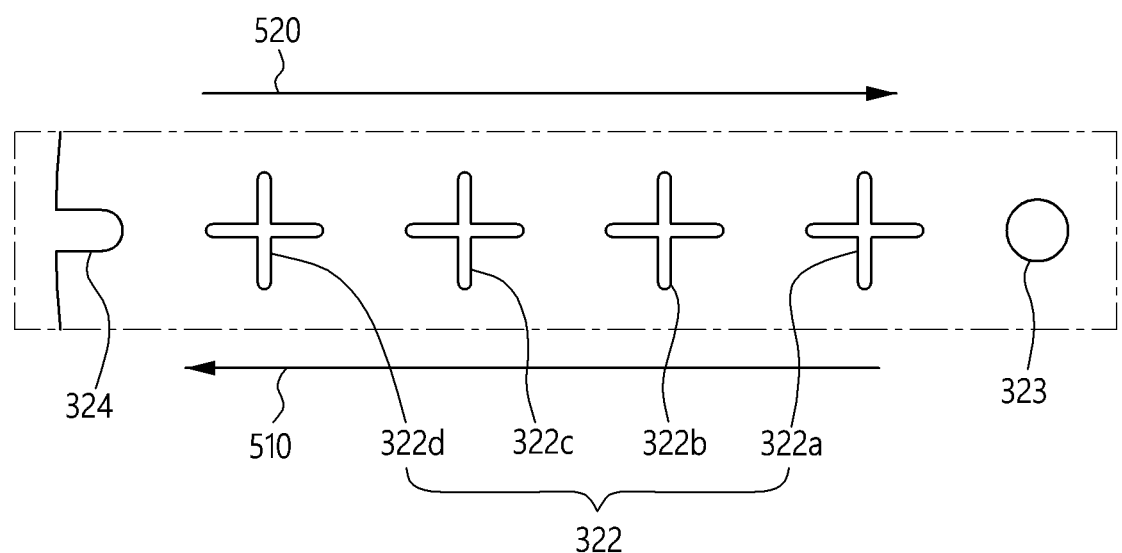
FIG. 17 is a second exemplary schematic view illustrating the arrangement structure of the plurality of slot pairs in the slot plate that constitutes the antenna module.
Figure 17:
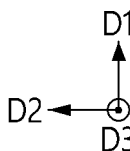

Alternatively, referring to FIG. 17, the first, second, third, and fourth slot pairs 322a, 322b, 322c, and 322d may be arranged to form a "+" shape with respect to the direction of the propagating wave 510 and the direction of the reflected wave 520. That is, the first, second, third, and fourth slot pairs 322a, 322b, 322c, and 322d may be linearly arranged in a "+" shape from the central area 323 of the slot plate 321 toward the edge of the slot plate 321. FIG. 17 is a second exemplary schematic view illustrating the arrangement structure of the plurality of slot pairs in the slot plate that constitutes the antenna module.

As previously described, the slot pairs 322 may be arranged radially from the central area 323 of the slot plate 321 to form concentric circles around the central area 323.

A first group 610 may be disposed around the circumference of the central area 323 of the slot plate 321, a second group 620 may be arranged on the outside of the first group 610, and an N-th group 630 may be disposed on the outside of its previous group from the central area 323 of the slot plate 321. Here, N is a natural number. Each of the first, second, and N-th groups 610, 620, and 630 may include a plurality of slot pairs.

The slot pairs 322 may be formed in the slot plate 321 not to overlap with one another. That is, slot pairs 322 belonging to the same group may be formed without overlapping with one another. Additionally, slot pairs 322 belonging to different groups may also be formed without overlapping with one another.

The number of slot pairs 322 included in the first group 610 may differ from the number of slot pairs 322 included in the second group 620. That is, each of the first, second, and N-th groups 610, 620, and 630 may include different numbers of slot pairs 322.

Figure 18:
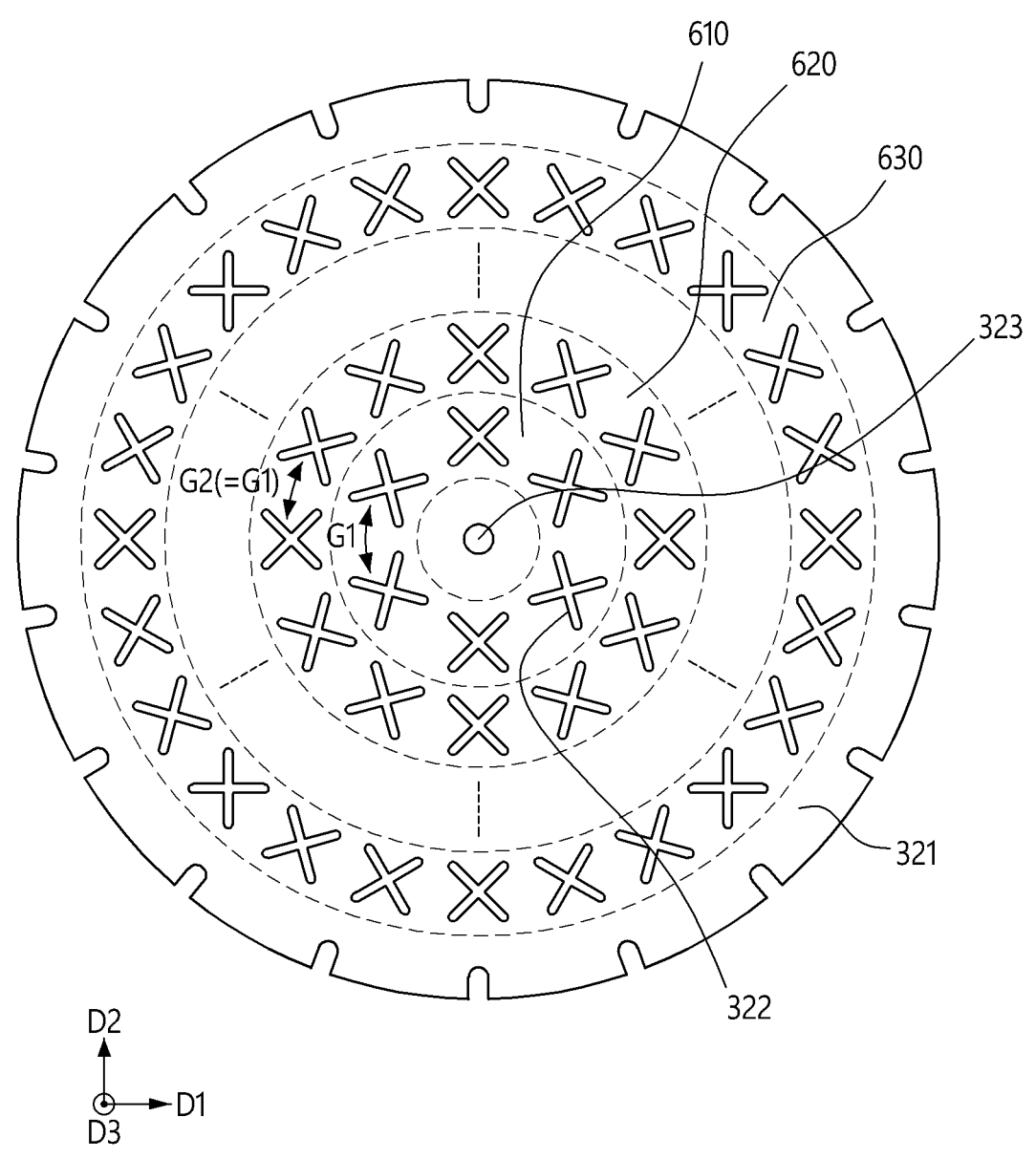
FIG. 18 is a third exemplary schematic view illustrating the arrangement structure of the plurality of slot pairs in the slot plate that constitutes the antenna module.

Referring to FIG. 18, the number of slot pairs 322 included in the second group 620 may be greater than the number of slot pairs 322 included in the first group 610. In other words, the number of slot pairs 322 included in each of the first, second, and N-th groups 610, 620, and 630 may increase from the first group 610 to the second group 620 to the N-th group 630. FIG. 18 is a third exemplary schematic view illustrating the arrangement structure of the plurality of slot pairs in the slot plate that constitutes the antenna module.

When different numbers of slot pairs 322 are included in each of the first, second, and N-th groups 610, 620, and 630, a spacing G1 between two adjacent slot pairs 322 in the first group 610 may be the same as a spacing G2 between two adjacent slot pairs 322 in the second group 620.

Referring to FIG. 18, the spacing G2 may be the same as the spacing G1, i.e., G2=G1. In other words, the spacing between adjacent slot pairs 322 in each of the first, second, and N-th groups 610, 620, and 630 may all be identical from the first group 610 to the N-th group 630.

However, the present disclosure is not limited to this. Alternatively, the spacing between adjacent slot pairs 322 in each of the first, second, and N-th groups 610, 620, and 630 may all differ from the first group 610 to the second group 620 to the N-th group 630. Yet alternatively, the spacing between adjacent slot pairs 322 may be identical in some of the first, second, and N-th groups 610, 620, and 630 and may differ in the other groups.

The size of the slot pairs 322 included in each of the first, second, and N-th groups 610, 620, and 630 may be identical. In other words, the size of the slot pairs 322 in the first group 610 may be the same as the size of the slot pairs 322 in the second group 620. Moreover, the size of the slot pairs 322 in the first group 610 may also be the same as the size of the slot pairs 322 included in the N-th group 630.

However, the present disclosure is not limited to this. Alternatively, the size of the slot pairs 322 included in each of the first, second, and N-th groups 610, 620, and 630 may all differ from the first group 610 to the second group 620 to the N-th group 630.

Figure 19:
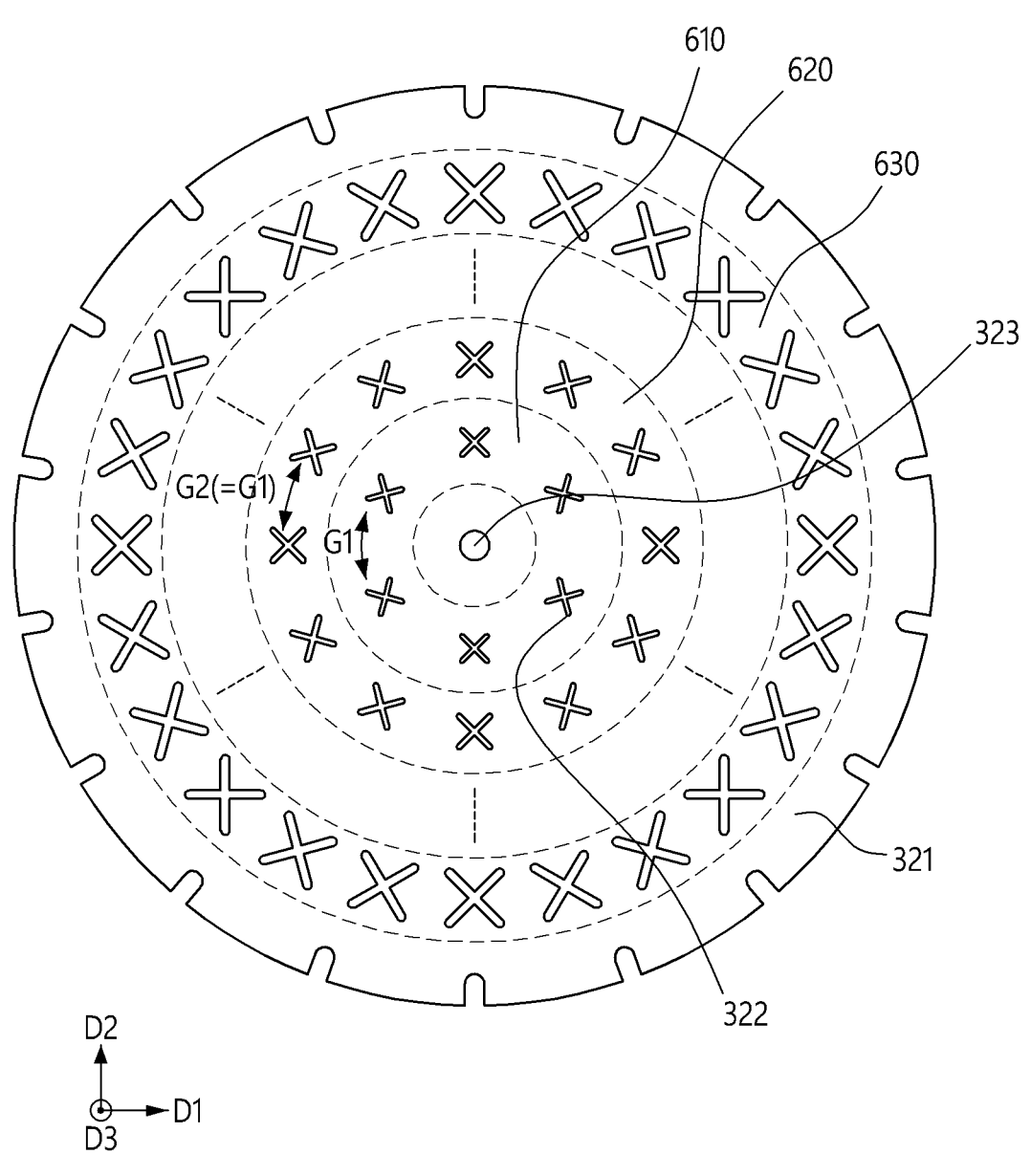
FIG. 19 is a fourth exemplary schematic view illustrating the arrangement structure of the plurality of slot pairs in the slot plate that constitutes the antenna module.

For example, the size of the slot pairs 322 included in each of the first, second, and N-th groups 610, 620, and 630 may increase from the first group 610 to the second group 620 to the N-th group 630. Referring to FIG. 19, the size of the slot pairs 322 in the second group 620 may be greater than the size of the slot pairs 322 in the first group 610. Furthermore, the size of the slot pairs 322 in the N-th group 630 may be greater than the size of the slot pairs 322 in the second group 620. FIG. 19 is a fourth exemplary schematic view illustrating the arrangement structure of the plurality of slot pairs in the slot plate that constitutes the antenna module.

Various embodiments of the antenna module 320 have been described so far with reference to FIGS. 9 through 19. The effects of the antenna module 320 will hereinafter be described.

To form a large-area high-density plasma, an antenna unit including a slot antenna may be used as an electrode. For example, an antenna unit including an RLSA may be used as an electrode. However, as the RLSA was developed as a communication antenna for long-distance radiation, the RLSA is not suitable for the environment within a process chamber where plasma is generated at an ultra-close range. To address such issues, the antenna unit 280, which includes the antenna module 320, may be provided.

Figure 20:
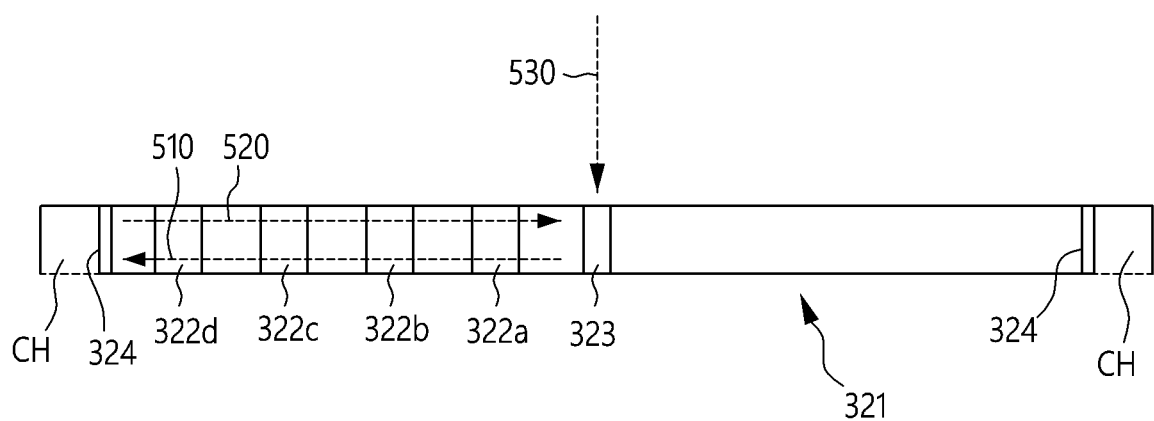
FIG. 20 is a first exemplary schematic view illustrating the effects of an antenna unit according to an embodiment of the present disclosure.
Figure 20:
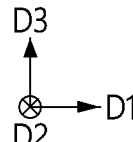

FIG. 20 is a first exemplary schematic view illustrating the effects of an antenna unit according to an embodiment of the present disclosure. Referring to FIG. 20, a microwave 530 is incident upon the central region 323 of the slot plate 321, and may radiate radially along the radial direction of the slot plate 321. In other words, when the microwave 530 is incident upon the central region 323 of the slot plate 321, its propagating wave 510 may proceed from the central region 323 to an end portion 324 of the slot plate 321.

As previously described, the antenna module 320 may be surrounded by the chamber housing CH. That is, the end portion 324 of the slot plate 321 is not exposed to the outside, and may be enclosed by the chamber housing CH. Therefore, the propagating wave 510 is reflected at the end portion 324 of the slot plate 321, and its reflected wave 520 may proceed from the end portion 324 to the central region 323 of the slot plate 321. The direction of the reflected wave 520 may be the opposite of the direction of the propagating wave 510.

The propagating wave 510 and the reflected wave 520 may interfere with each other. Due to the interference between the propagating wave 510 and the reflected wave 520, a standing wave may be generated within the antenna module 320. Alternatively, a standing wave may be generated within the second dielectric module 330, which is disposed on the antenna module 320.

Due to the mutual interference of the propagating wave 510 and the reflected wave 520, an overlap may occur between the propagating wave 510 and the reflected wave 520. In this case, constructive interference may occur where the crests of the propagating wave 510 add up with the crests of the reflected wave 520 or the troughs of the propagating wave 510 add up with the troughs of the reflected wave 520. Also, destructive interference may occur when the crests of the propagating wave 510 meets the troughs of the reflective wave 520, or vice versa.

The first, second, third, and fourth slot pairs 322a, 322b, 322c, and 322d, which are arranged in a row along the direction from the central region 323 to the end portion 324 of the slot plate 321, may be arranged in consideration of the mutual interference between the propagating wave 510 and the reflected wave 520. Preferably, the first, second, third, and fourth slot pairs 322a, 322b, 322c, and 322d may be arranged in a row in consideration of the electric field E-Field of the standing wave, to maximize radiation efficiency.

The first, second, third, and fourth slot pairs 322a, 322b, 322c, and 322d may be arranged at regular intervals to achieve maximum radiation efficiency. The first, second, third, and fourth slot pairs 322a, 322b, 322c, and 322d may be spaced apart from one another at intervals of their respective distance from the end portion 324 of the slot plate 321 (i.e., the outer end of the slot plate 321), calculated according to the following equation: the distance=$((1/2*n)+1/4)*\lambda g$ where $\lambda g$ refers to the wavelength within the waveguide and n is 0 or a positive integer (or natural number).

For example, the fourth slot pair 322d may be arranged at a distance of $1/4\lambda g$ ($=((1/2*0)+1/4)*\lambda g$) from the end portion 324 of the slot plate 321, the third slot pair 322c may be arranged at a distance of $3/4\lambda g$ ($=((1/2*1)+1/4)*\lambda g$) from the end portion 324 of the slot plate 321, the second slot pair 322b may be arranged at a distance of $5/4/g$ ($=((1/2*2)+1/4)*\lambda g$) from the end portion 324 of the slot plate 321, and the first slot pair 322a may be arranged at a distance of $7/4\lambda g$ ($=((1/2*3)+1/4)*\lambda g$) from the end portion 324 of the slot plate 321.

However, the present disclosure is not limited to this. Alternatively, the first, second, third, and fourth slot pairs 322a, 322b, 322c, and 322d may be arranged by selectively applying the value of n depending on the size of slots.

For example, the fourth slot pair 322d may be arranged at a distance of $3/4\lambda g$ ($=((1/2*1)+1/4)*\lambda g$) from the end portion 324 of the slot plate 321, and the second slot pair 322b may be arranged at a distance of $9/4\lambda g$ ($=((1/2*4)+1/4)*\lambda g$) from the central region 323 of the slot plate 321.

Figure 21:
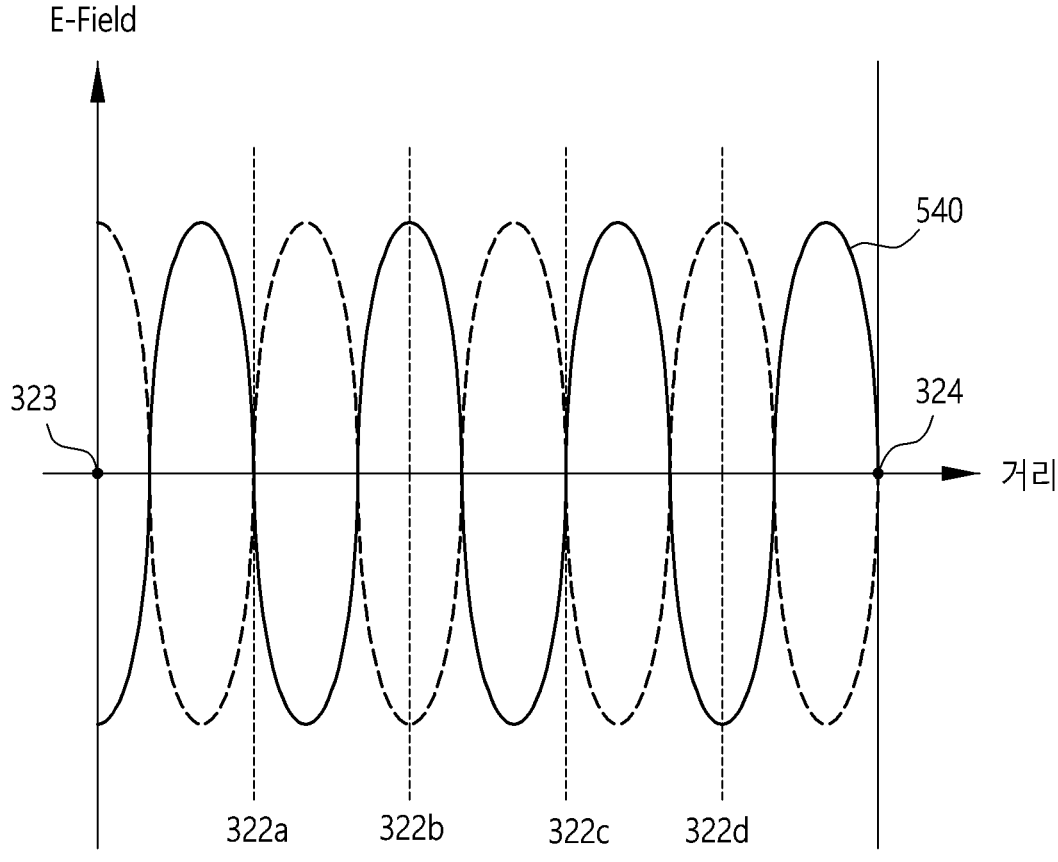
FIG. 21 is a second exemplary schematic view illustrating the effects of the antenna unit according to an embodiment of the present disclosure.

The first, second, third, and fourth slot pairs 322a, 322b, 322c, and 322d may be disposed at points where the electric field E-Field of the standing wave 540 reaches its maximum and minimum. Referring to FIG. 21, the first and third slot pairs 322a and 322c may be disposed at the troughs of the standing wave 540, and the second and fourth slot pairs 322b and 322d may be disposed at the crests of the standing wave 540. FIG. 21 is a second exemplary schematic view illustrating the effects of the antenna unit according to an embodiment of the present disclosure.

Alternatively, the second and fourth slot pairs 322b and 322d may be disposed only at points where the electric field E-Field of the standing wave 540 reaches its maximum. For example, the first, second, third, and fourth slot pairs 322a, 322b, 322c, and 322d may all be disposed at the crests of the standing wave 540. In another example, the second and fourth slot pairs 322b and 322d may be disposed at the crests of the standing wave 540, and the first and third slot pairs 322a and 322c may not be formed in the slot plate 321.

By arranging the slot pairs 322 at the points where the electric field E-Field of the standing wave 540 reaches its maximum, the electric field E-Field can be maximized during antenna radiation, and as a result, the efficiency of antenna radiation and the intensity of plasma can be increased. Particularly, by positioning the second and fourth slot pairs 322b and 322d at the crests of the standing wave 540, where the electric field E-Field reaches its maximum, the radiation efficiency at the second and fourth slot pairs 322b and 322d can be maximized, and the intensity of plasma can be enhanced accordingly.

Referring again to FIG. 6, the second dielectric module 330 may be disposed on the antenna module 320. The second dielectric module 330 may be formed to cover only the top surface of the antenna module 320, but the present disclosure is not limited thereto.

Alternatively, the second dielectric module 330 may be formed to cover both the top surface and side surfaces of the antenna module 320. The second dielectric module 330 may be formed to have the same width as the first dielectric module 310.

The second dielectric module 330 may be formed of an insulating material. For example, the second dielectric module 330 may include quartz or $Al_2O_3$, and may be provided as a dielectric window with a predetermined dielectric constant. When viewed in the vertical direction (e.g., the third direction D3), the second dielectric module 330 may have a cylindrical cross-sectional shape, but the present disclosure is not limited thereto. That is, the shape of the second dielectric module 330 may vary depending on the overall shape of the substrate treating apparatus 200. Also, when viewed in the horizontal direction (e.g., the first or second direction D1 or D2), the second dielectric module 330 may be formed to have a planar shape, but the present disclosure is not limited thereto. Alternatively, the second dielectric module 330 may be formed to have a dome shape.

Figure 22:
FIG. 22 is a second exemplary schematic view illustrating the antenna unit that constitutes the substrate treating apparatus.
Figure 22:
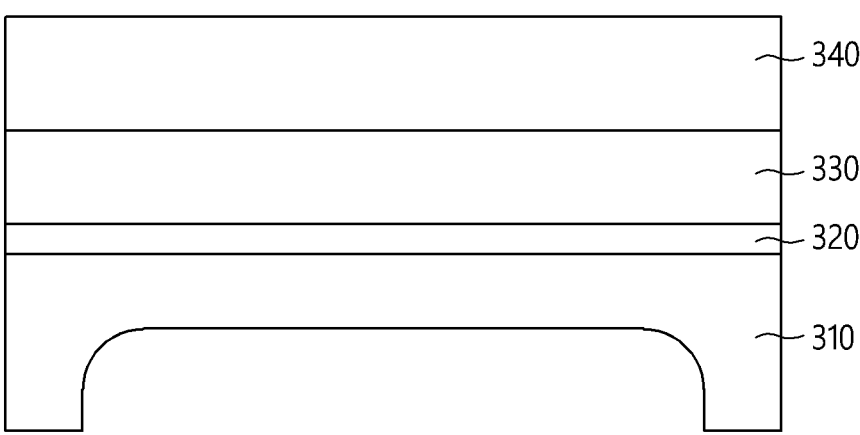
Figure 22:
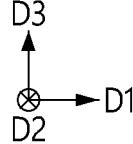

The antenna unit 280 may be configured to further include a temperature control module 340 in addition to the first dielectric module 310, the antenna module 320, and the second dielectric module 330. Referring to FIG. 22, the temperature control module 340 may be disposed on the second dielectric module 330. For example, the temperature control module 340 may be provided as a cooling plate. The temperature control module 340 may be grounded. FIG. 22 is a second exemplary schematic view illustrating the antenna unit that constitutes the substrate treating apparatus.

Embodiments of the present disclosure have been described above with reference to the accompanying drawings, but the present disclosure is not limited thereto and may be implemented in various different forms. It will be understood that the present disclosure can be implemented in other specific forms without changing the technical concept or gist of the present disclosure. Therefore, it should be understood that the embodiments set forth herein are illustrative in all respects and not limiting.

What is claimed is:

1. An antenna unit installed in a substrate treating apparatus antenna unit, which treats a substrate using plasma, to operate as an electrode, the antenna unit comprising:
a first dielectric module provided as a top cover for the chamber housing;
an antenna module disposed on the first dielectric module and including a slot plate and a plurality of slot pairs, which are formed in the slot plate; and
a second dielectric module disposed on the antenna module,
wherein the slot pairs are arranged radially from a central region of the slot plate, and wherein the slot pairs are arranged in a row at intervals of their respective distance from an outer end of the slot plate, calculated by the following equation: the distance=$((1/2*n)+1/4)*\lambda g$ where $\lambda g$ refers to the wavelength within a waveguide and n is 0 or a positive integer.

2. The antenna unit of claim 1, wherein the slot pairs are arranged in consideration of an interference between a propagating wave moving from the central region to the outer end of the slot plate and a reflective wave of the propagating wave.

3. The antenna unit of claim 1, wherein the slot pairs are arranged in consideration of an electric field generated by both a propagating wave moving from the central region to the outer end of the slot plate and a standing wave generated by a reflective wave of the propagating wave.

4. The antenna unit of claim 1, wherein the slot pairs are disposed at positions related to crests of a propagating wave moving from the central region to the outer end of the slot plate and crests of a standing wave generated by a reflective wave of the propagating wave.

5. The antenna unit of claim 1, wherein a size of the slot pairs increases in a direction from the central region to the outer end of the slot plate.

6. The antenna unit of claim 1, wherein the slot pairs are arranged in the row at regular intervals from the central region to the outer end of the slot plate.

7. The antenna unit of claim 6, wherein the slot pairs are arranged in the row in the same shape.

8. The antenna unit of claim 7, wherein the slot pairs are arranged in the row to form an X shape.

9. The antenna unit of claim 1, wherein
each of the slot pairs includes first and second slots, and
the first slot intersects with the second slot.

10. The antenna unit of claim 9,
wherein the first slot is divided into first and second portions based on an intersection point between the first and second slots, and
a length of the first portion is the same as a length of the second portion.

11. The antenna unit of claim 10, wherein
the second slot is divided into third and fourth portions based on the intersection point between the first and second slots, and
an angle between the first and third portions is the same as an angle between the first and fourth portions.

12. The antenna unit of claim 1, wherein the slot pairs are further arranged in a concentric circular fashion around the central region of the slot plate.

13. The antenna unit of claim 1, wherein
the internal space of the chamber housing includes a plasma region where radicals are generated based on the process gas, and
a size of the antenna module is the same as or greater than a size of the plasma region.

14. The antenna unit of claim 1, wherein
the antenna unit further includes a temperature control module, which is disposed on the second dielectric module, and
the temperature control module is grounded.

* * * * *